United States Patent
Yamazaki

(10) Patent No.: US 6,891,236 B1
(45) Date of Patent: May 10, 2005

(54) SEMICONDUCTOR DEVICE AND METHOD OF FABRICATING THE SAME

(75) Inventor: Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/479,262

(22) Filed: Jan. 5, 2000

(30) Foreign Application Priority Data

Jan. 14, 1999 (JP) .......................................... 11-008496

(51) Int. Cl.[7] .............................................. H01L 29/72
(52) U.S. Cl. ...................... 257/410; 257/411; 257/412; 257/415; 257/324
(58) Field of Search ................................ 257/410, 411, 257/412, 415, 324

(56) References Cited

U.S. PATENT DOCUMENTS

| | | | |
|---|---|---|---|
| 4,990,365 A | | 2/1991 | Treichel et al. |
| 5,232,862 A | | 8/1993 | Heremans et al. |
| 5,247,190 A | | 9/1993 | Friend et al. |
| 5,324,690 A | | 6/1994 | Gelatos et al. |
| 5,373,171 A | | 12/1994 | Imai et al. |
| 5,399,502 A | | 3/1995 | Friend et al. |
| 5,536,360 A | | 7/1996 | Nguyen et al. |
| 5,643,826 A | | 7/1997 | Ohtani et al. |
| 5,756,250 A | | 5/1998 | Hirai et al. |
| 5,923,962 A | | 7/1999 | Ohtani et al. |
| 6,144,094 A | * | 11/2000 | Kobayashi ................... 257/411 |
| 6,177,323 B1 | * | 1/2001 | Wu .............................. 257/411 |

FOREIGN PATENT DOCUMENTS

| | | |
|---|---|---|
| EP | 0 394 054 | 10/1990 |
| EP | 0 566 838 | 10/1993 |
| EP | 0 999 595 | 5/2000 |
| JP | 62-156822 | 7/1987 |
| JP | 63-111173 | 5/1988 |
| JP | 63-120429 | 5/1988 |
| JP | 02-179947 | 7/1990 |
| JP | 02-234438 | 9/1990 |
| JP | 03-097846 | 4/1991 |
| JP | 04-367277 | 12/1992 |
| JP | 05-152328 | 6/1993 |
| JP | 07-130652 | 5/1995 |
| JP | 7-130652 | 5/1995 |
| JP | 07-278790 | 10/1995 |
| JP | 8-078329 | 3/1996 |
| JP | 08-078329 | 3/1996 |
| JP | 8-254713 | 10/1996 |
| JP | 08-254713 | * 10/1996 ................. 257/410 |
| JP | 08-330602 | 12/1996 |
| JP | 8-330602 | 12/1996 |
| JP | 10-092576 | 4/1998 |
| JP | 10-135468 | 5/1998 |
| JP | 10-135469 | 5/1998 |
| JP | 10-270363 | 10/1998 |
| WO | WO 90/13148 | 11/1990 |

OTHER PUBLICATIONS

Office Action mailed on Feb. 25, 2003 of U.S. patent application Ser. No. 09/472,079, which is a related application of the present application.

(Continued)

*Primary Examiner*—Edward Wojciechowicz
(74) *Attorney, Agent, or Firm*—Cook, Alex, McFarron, Manzo, Cummings & Mehler, Ltd.

(57) ABSTRACT

A semiconductor device using a TFT structure with high reliability is realized. As an insulating film used for the TFT, for example, a gate insulating film, a protecting film, an under film, an interlayer insulating film, or the like, a silicon nitride oxide film ($SiN_xB_yO_z$) containing boron is formed by a sputtering method. As a result, the internal stress of this film becomes $-5\times10^{10}$ dyn/cm$^2$ to $5\times10^{10}$ dyn/cm$^2$, preferably $-10^{10}$ dyn/cm$^2$ to $10^{10}$ dyn/cm$^2$, and the film has high thermal conductivity, so that it typically becomes possible to prevent deterioration due to heat generated at the time of an on operation of the TFT.

28 Claims, 17 Drawing Sheets

SECTIONAL STRUCTURE VIEW ALONG A-A'

OTHER PUBLICATIONS

JP 8–254713 English abstract.
JP 05–152328 English abstract.
JP 07–130652 English abstract.
JP 07–278790 English abstract.
JP 08–078329 English abstract.
JP 08–254713 English abstract.
JP 08–330602 English abstract.
JP 10–092576 English abstract.
JP 63–120429 English abstract.
JP 02–179947 English abstract.
JP 02–234438 English abstract.
JP 03–097846 English abstract.
JP 04–367277 English abstract.
JP 62–156822 English abstract.
JP 63–111173 English abstract.
JP 10–135468 English abstract.
JP 10–135469 English abstract.
JP 10–270363 English abstract.
European Search Report re application No. EP 99 12 5839, dated Apr. 6, 2000.
European Search Report re application No. EP 99 12 5839, dated Dec. 7, 2000.
Maeda et al., "A Low–Permittivity Interconnection Using An SiBN Interlayer," *IEEE Transactions On Electron Devices,* vol. 36, No. 9, pp. 1610–1614, Sep. 1989.
Schenk et al., "Polymers For Light Emitting Diodes," *Euro-Display '99,* Berlin, Germany, Sep. 6–9, 1999, pp. 33–37.
US patent application No. 09/472,079 (pending) to Yamazaki et al., including specification, claims, abstract, drawings and PTO filing receipt.
English abstract re Japanese patent application No. 7–130652.
English abstract re Japanese patent application No. 8–078329.
English abstract re Japanese patent application No. 8–330602.
English abstract re Japanese patent application No. 10–135468.
English abstract re Japanese patent application No. 10–135469.
English abstract re Japanese patent application No. 10–270363.

* cited by examiner

ACTIVATION STEP

PATTERNING STEP

FORMING STEP OF INTERLAYER INSULATING FILM

FORMING STEP OF SOURCE WIRING LINE AND DRAIN WIRING LINE

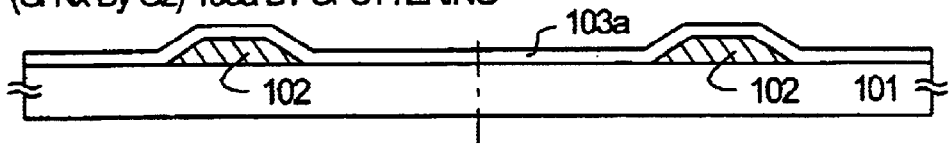
FIG. 4A FORMING STEP OF SILICON NITRIDE OXIDE FILM (Si Nx By Oz) 103a BY SPUTTERING
FIG. 4B FORMING STEP OF INSULATING FILM 103b AND SEMICONDUCTOR FILM
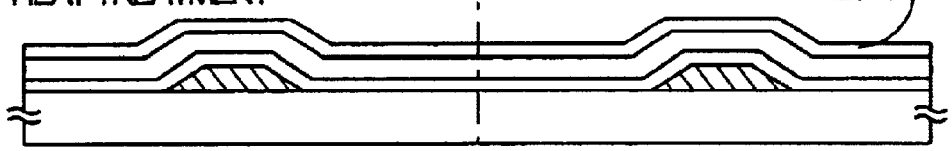
FIG. 4C CRYSTALLIZATION STEP BY HEAT TREATMENT
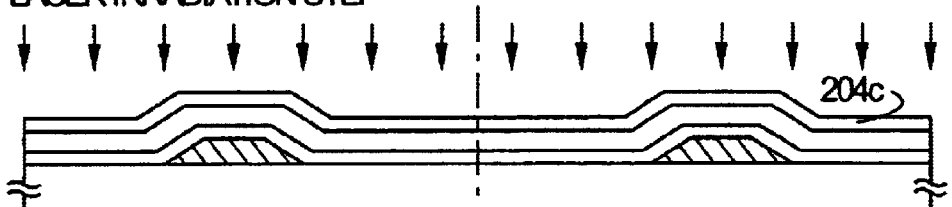
FIG. 4D LASER IRRADIATION STEP
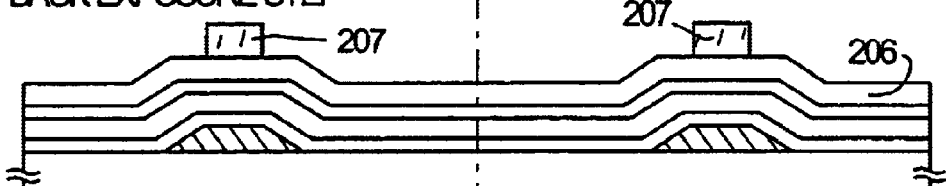
FIG. 4E BACK EXPOSURE STEP
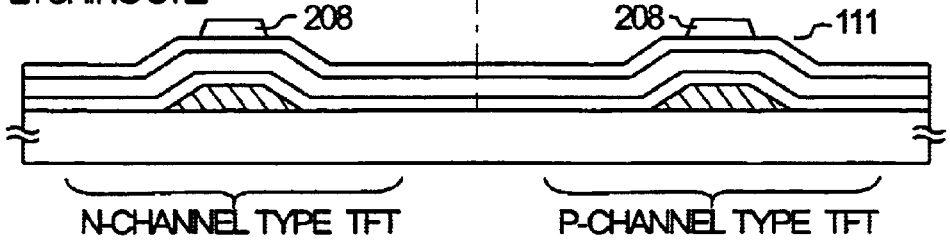
FIG. 4F ETCHING STEP

ACTIVATION AND GETTERING STEP

PATTERNING STEP

FORMING STEP OF INTERLAYER INSULATING FILM

FORMING STEP OF SOURCE WIRING LINE AND DRAIN WIRING LINE

N-CHANNEL TYPE TFT | P-CHANNEL TYPE TFT

TOP VIEW OF CMOS CIRCUIT

SECTIONAL STRUCTURE VIEW ALONG A - A'

CIRCUIT DIAGRAM OF CMOS

PROJECTION DEVICE (THREE PLATE TYPE)

LIGHT SOURCE OPTICAL SYSTEM

SEMICONDUCTOR DEVICE AND METHOD OF FABRICATING THE SAME

BACKGROUND OF THE INVENTION

1. Field of the Invention

The present invention relates to a method of fabricating a semiconductor device using a crystalline semiconductor film formed by crystallizing an amorphous semiconductor thin film, and particularly to a method of improving reliability of a semiconductor device. The semiconductor device of the present invention includes not only a component such as a thin film transistor (TFT) or a MOS transistor but also an electro-optical device such as a display device or an image sensor including a semiconductor circuit constituted by such insulated gate transistors. In addition, the semiconductor device of the present invention includes an electronic equipment incorporating such a display device and an electro-optical device.

2. Description of the Related Art

In recent years, a technique for constructing a semiconductor circuit by forming TFTs on a glass substrate or the like has been rapidly developed. As such a semiconductor circuit, an electro-optical device such as an active matrix type liquid crystal display device is typical.

The active matrix type liquid crystal display device is a monolithic display device in which a pixel matrix circuit and a driver circuit are provided on the same substrate. Moreover, development of a system-on-panel having a built-in logic circuit such as a memory circuit or a clock generating circuit has also been made.

Since the driver circuit or the logic circuit of the active matrix type liquid crystal display device is required to perform a high speed operation, it is unsuitable to use a noncrystalline silicon film (amorphous silicon film) as an active layer. Thus, under the present circumstances, a TFT having an active layer of a crystalline silicon film (polysilicon) has become the mainstream.

Since a TFT can be formed on a transparent glass substrate, application and development to an active matrix type display device has been actively made. Since a TFT using a polysilicon film can obtain a high mobility, it is possible to realize image display of high fineness by integrating functional circuits on the same substrate.

In the active matrix type display device, as the resolution of a screen becomes high, one million TFTs become necessary even for only pixels. Further, if a functional circuit is added, more than one million TFTs becomes necessary. In order to make the liquid crystal display device operate stably, it has been necessary to secure reliability of individual TFTs and to make them operate stably.

In such an active matrix type display device, especially in the case where a TFT is provided on a substrate (for example, a glass substrate) having bad thermal conductivity and good heat retaining property, since a large voltage and current is applied to a TFT of a peripheral driver circuit, a semiconductor layer generates heat and remarkably lowers the reliability of the TFT.

SUMMARY OF THE INVENTION

The present invention has been made in view of the foregoing problem, and therefore has an object to provide a technique for equalizing a heat distribution all over a semiconductor device by quickly dissipating heat generated when a TFT provided on an insulating surface is driven.

Moreover, in the case where a TFT is formed by laminating thin films formed by a CVD method, a sputtering method or the like, when films having different internal stresses to some degree are laminated, film peeling has occurred by the interaction of the inner stresses of the respective films.

Another object of the present invention is to provide a technique for solving this problem of the inner stress.

In order to attain the foregoing objects, the present invention is characterized in that an insulating film ($SiN_xB_yO_z$: where, X, Y and Z are values expressing the composition ratio, and X>0, Y>0, and Z>0) superior in thermal conductivity, which is formed by using a sputtering method in which film formation can be made at a low temperature and productivity is superior, is used as an insulating film of a semiconductor component or a semiconductor device. Since the insulating film ($SiN_xB_yO_z$) of the present invention contains boron of 0.1 to 50 atoms % or 1 to 50 atoms %, preferably 1 to 10 atoms %, the film has high thermal conductivity, and has an effect to prevent deterioration of characteristics due to heat of a semiconductor device. Moreover, since the insulating film ($SiN_xB_yO_z$) of the present invention has a blocking effect to movable ions such as sodium, the film has also an effect to prevent these ions from intruding into the semiconductor device, especially into a channel formation region from the substrate or the like. In addition, since the insulating film ($SiN_xB_yO_z$) of the present invention contains oxygen of 1 to 30 atoms %, the internal stress of the film can be made typically $-5 \times 10^{10}$ $dyn/cm^2$ to $5 \times 10^{10}$ $dyn/cm^2$, preferably $-10^{10}$ $dyn/cm^2$ to $10^{10}$ $dyn/cm^2$, stresses of the respective films are reduced, and it is possible to make film peeling hard to cause.

The structure of the present invention disclosed in the present specification resides in a semiconductor device comprising:

a gate electrode formed on an insulating surface;

a gate insulating film on the gate electrode; and a source region, a drain region, and the channel formation region formed between the source region and the drain region, the respective regions being in contact with the gate insulating film;

characterized in that the gate insulating film includes a layer of a silicon nitride oxide film containing boron.

Further, another structure of the present invention resides on a semiconductor device comprising:

a source region, a drain region, and a channel formation region formed between the source region and the drain region, the respective regions being in contact with an insulating surface;

a gate insulating film on the channel formation region; and a gate electrode to be in contact with the gate insulating film;

characterized in that the gate insulating film includes a layer of a silicon nitride oxide film containing boron.

Still further, another structure of the present invention resides in a semiconductor device comprising:

an insulating film formed on an insulating surface; and a semiconductor component formed on the insulating film;

characterized in that the insulating film is a silicon nitride oxide film containing boron.

Yet further, another structure of the present invention resides in a semiconductor device comprising:

a semiconductor component formed on an insulating surface; and an insulating film for protecting the semiconductor component;

characterized in that the insulating film is a silicon nitride oxide film containing boron.

Furthermore, the structure of a fabricating method according to the present invention for executing the present invention resides in a method of fabricating a semiconductor device, characterized by comprising the step of:

forming a silicon nitride oxide film by carrying out sputtering with a semiconductor target added with boron in an atmosphere containing a nitric oxide gas.

Further, in the above-mentioned structure, it is characterized in that the nitric oxide gas is one kind or plural kinds of gases selected from the group consisting of a nitrogen monoxide gas, a dinitrogen oxide gas, a nitrogen dioxide gas, and a nitrogen trioxide gas, or a gas obtained by diluting the gas with an inert gas or an oxygen gas.

Still further, another structure of a fabricating method of the present invention resides in a method of fabricating a semiconductor device, characterized by comprising the step of:

forming a silicon nitride oxide film containing boron by carrying out sputtering with a semiconductor target in an atmosphere including a gas containing boron and a nitric oxide gas.

In the above-mentioned structure, it is characterized in that the nitric oxide gas is one kind or plural kinds of gases selected from the group consisting of a nitrogen monoxide gas, a dinitrogen oxide gas, a nitrogen dioxide gas, and a nitrogen trioxide gas, or a gas obtained by diluting the gas with an inert gas or an oxygen gas.

In the above-mentioned structure, it is characterized in that sputtering is carried out by continuously or stepwisely changing a content ratio of boron in the atmosphere.

Further, another structure of a fabricating method of the present invention resides in a method of fabricating a semiconductor device, characterized by comprising the steps of:

forming a gate electrode on an insulating surface;

forming a gate insulating film made of a silicon nitride oxide film containing boron on the gate electrode; and forming a semiconductor thin film on the gate insulating film.

Still further, another structure of a fabricating method of the present invention resides in a method of fabricating a semiconductor device, characterized by comprising the steps of:

forming a semiconductor thin film on an insulating surface;

forming a gate insulating film made of a silicon nitride oxide film containing boron on the semiconductor thin film; and forming a gate electrode on the gate insulating film.

BRIEF DESCRIPTION OF THE DRAWINGS

In the accompanying drawings:

FIGS. 4A to 4F are explanatory views of fabricating steps of the TFT of Embodiment 2;

DETAILED DESCRIPTION OF THE INVENTION

Figure 1A:
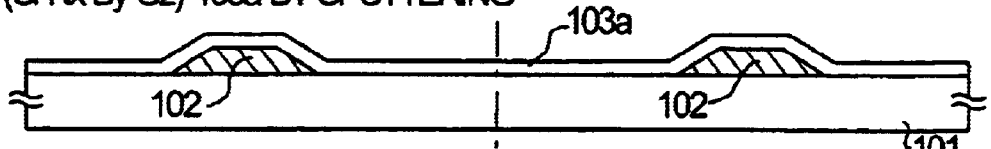
FIGS. 1A to 1E are explanatory views of fabricating steps of a TFT of Embodiment 1.

The mode of carrying out the present invention will be described with reference to FIGS. 1A to 1E. Here, a description will be made on a bottom gate type TFT including a gate insulating film made of an insulating film ($SiN_xB_yO_z$) by a sputtering method and on a method of fabricating the same.

First, a substrate 101 is prepared. As the substrate 101, a glass substrate, a quartz substrate, an insulating substrate of crystalline glass or the like, a ceramic substrate, a semiconductor substrate, a plastic substrate (polyethylene terephthalate substrate), or the like may be used.

Next, a conductive film made of a conductive material formed on the substrate 101 by using a sputtering method is patterned to form a gate wiring line (including a gate electrode) 102. As the material of the gate wiring line 102, a material containing a conductive material or a semiconductor material as its main ingredient, for example, a metal material such as Ta (tantalum), Mo (molybdenum), Ti (titanium), W (tungsten), or Cr (chromium), silicide as a compound of the metal material and silicon, a material such as polysilicon having N-type or P-type conductivity, or a structure including at least one layer of a material layer containing a low resistance metal material such as Cu (copper) or Al (aluminum), may be used without specific limitation.

Next, a silicon nitride oxide film ($SiN_xB_yO_z$) 103a is formed on the substrate 101 and the gate electrode 102 by the sputtering method.

A sputtering apparatus used for the present invention basically includes a chamber, an exhaust system for evacuating the chamber, a gas introducing system for introducing a sputtering gas into the chamber, an electrode system made of a target and an RF electrode, and a sputtering power source connected to the electrode system. As the sputtering gas, a nitric oxide gas is used. The nitric oxide gas is one kind or plural kinds of gases selected from a nitrogen monoxide gas, a dinitrogen oxide gas, a nitrogen dioxide gas, and a nitrogen trioxide gas, or a gas obtained by diluting the foregoing gas with an inert gas (Ar, He, Ne, $N_2$), an oxygen gas, or ammonia ($NH_3$). The condition of sputtering (sputtering gas, gas flow rate, film formation pressure, temperature of the substrate, film formation electric power, etc.) may be suitably determined by an operator in view of the size of the target, the size of the substrate, the film thickness of the silicon nitride oxide film ($SiN_xB_yO_z$), the film quality of the silicon nitride oxide film ($SiN_xB_yO_z$), and the like. It is also possible to use DC electric power instead of RF electric power.

One of the features of the present invention is a method of forming this silicon nitride oxide film ($SiN_xB_yO_z$) 103a, and as the forming method, there are two methods as described below.

The first forming method of the present invention is a sputtering method using a target of single crystal silicon added with boron in an atmosphere containing the nitric oxide gas. In the present invention, a semiconductor target of single crystal or polycrystal preferably added with boron of $1 \times 10^{17}$ cm$^{-3}$ or more is used. The composition ratio of boron in the silicon nitride oxide film ($SiN_xB_yO_z$) can be changed by changing the boron content of the target. Moreover, an insulating film having a further complicated composition ratio can be obtained by using a plurality of targets, for example, a target added with boron and a target added with an impurity (for example, gallium (Ga)) to give another conductivity type at the same time.

The second forming method of the present invention is a sputtering method using a target made of single crystal silicon in an atmosphere containing a nitric oxide gas and a gas containing boron (for example, diborane: $B_2H_6$). The composition ratio of the insulating film ($SiN_xB_yO_z$) containing silicon nitride oxide as its main ingredient can be changed by changing the gas flow rate containing boron. Besides, such a structure may be employed that the film is made to have a concentration gradient of boron by changing the ratio of boron in the atmosphere continuously or stepwise.

By using the foregoing first forming method or the second forming method, it is possible to form the silicon nitride oxide film ($SiN_xB_yO_z$) 103a in which boron of 0.1 to 50 atoms % or 1 to 50 atoms %, preferably 0.1 to 10 atoms % is contained in the film to raise thermal conductivity, and oxygen of 1 to 30 atoms % is contained in the film to raise adhesion. Since this silicon nitride oxide film ($SiN_xB_yO_z$) 103a contains boron, the film has high thermal conductivity as compared with a conventional silicon nitride film (SiN). Moreover, since this silicon nitride oxide film ($SiN_xB_yO_z$) 103a contains oxygen of 1 to 30 atoms %, it has high adhesion as compared with a conventional silicon nitride film (SiN), so that film peeling is hard to cause. It is preferable that the internal stress of this silicon nitride oxide film ($SiN_xB_yO_z$) is typically $-5 \times 10^{10}$ dyn/cm$^2$ to $5 \times 10^{10}$ dyn/cm$^2$, preferably $-10^{10}$ dyn/cm$^2$ to $10^{10}$ dyn/cm$^2$ (values obtained in stress measurement by Model-30114 of Ionic System Inc.). Of course, it is needless to say that this silicon nitride oxide film ($SiN_xB_yO_z$) has a sufficient insulation property. Especially, when the silicon nitride oxide film ($SiN_xB_yO_z$) is formed to be in contact with a gate electrode, heat generated at the time of driving a TFT can be quickly and easily dissipated. Thus, it is possible to effectively equalize a heat distribution all over the semiconductor device.

Figure 1B:

Next, an insulating film 103b and an amorphous semiconductor film 104 are sequentially formed so as to make a laminate without opening to the air (FIG. 1B). By doing so, pollution of the interface can be prevented. Here, although the two-layer insulating films of the insulating film 103a and the insulating film 103b are adopted as the gate insulating film, a single layer or a laminate structure of not less than three layers may be used.

As the amorphous semiconductor film 104, it is possible to use an amorphous semiconductor film containing silicon, for example, an amorphous silicon film, an amorphous semiconductor film having microcrystallinity, a microcrystal silicon film, an amorphous germanium film, an amorphous silicon germanium film expressed by $Si_xGe_{1-x}(0<X<1)$, or a laminate film of these, the respective films having a thickness range of 10 to 80 nm, preferably 15 to 60 nm. As means for forming the insulating film 103b and the amorphous semiconductor 104, a forming method such as a thermal CVD method, a plasma CVD method, a low pressure thermal CVD method, an evaporation method, or a sputtering method may be used.

Figure 1C:
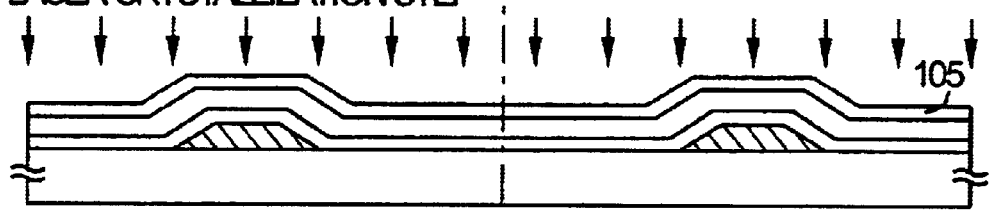

Next, a crystallizing treatment of the amorphous semiconductor film 104 is carried out, so that a crystalline semiconductor film 105 is formed (FIG. 1C). As the crystallizing treatment, it is possible to use any well-known means, for example, a thermal crystallizing treatment, a crystallizing treatment by irradiation of infrared light or ultraviolet light (hereinafter referred to as laser crystallization), a thermal crystallizing treatment using a catalytic element, or a treatment of a combination of these crystallizing treatments.

The thus obtained crystalline semiconductor film 105 is used as an active layer, so that a bottom gate type TFT is fabricated. Incidentally, here, although the crystalline semiconductor film 105 is used as the active layer, the bottom gate type TFT may be fabricated by using the amorphous semiconductor film as the active layer without carrying out crystallization. Since the subsequent steps may comply with a well-known fabricating method, their detailed explanation is omitted.

Here, although the description has been made on the example in which the insulating film ($SiN_xB_yO_z$) containing boron of 0.1 to 50 atoms % or 1 to 50 atoms %, preferably 0.1 to 10 atoms % and oxygen of 1 to 30 atoms % is used as one layer of the gate insulating film of the bottom gate type TFT, the invention is not particularly limited as long as a film is an insulating film. For example, the insulating film of the invention can be used as an under film, an interlayer insulating film, a mask insulating film, a channel protecting film, a protecting film, or the like. In addition, the insulating film of the invention can be applied to an insulating film used for a top gate type TFT, for example, an under film, a gate insulating film, a mask insulating film, an interlayer insulating film, a protecting film, or the like. Besides, the insulating film of the invention can be applied to an insulating film used for a forward stagger TFT. Like this, the present invention can be applied irrespectively of the TFT structure.

In this way, since the semiconductor device using the insulating film ($SiN_xB_yO_z$) containing boron of 0.1 to 50 atoms % or 1 to 50 atoms %, preferably 0.1 to 10 atoms % and oxygen of 1 to 30 atoms % as the insulating film can quickly dissipate heat generated when the TFT is driven and can equalize a heat distribution all over the semiconductor device, high reliability can be obtained as compared with the prior art.

Of course, a silicon nitride oxide film ($SiN_{1-x}O_x(0<X<1)$: X is a value expressing a composition ratio) in which oxygen of 1 to 30 atoms % is contained to raise adhesion can also be used as an insulating film employed for a TFT.

Although preferred embodiments of the present invention will be described below, it is needless to say that the present invention is not limited to these embodiments.

Embodiment 1

An embodiment of the present invention will be described below with reference to FIGS. 1A to 3D.

First, as a substrate 101, a glass substrate (Corning 1737; distortion point 667° C.) was prepared. Next, a gate wiring line (including a gate electrode) 102 of a laminate structure (not shown for simplification) was formed on the substrate 101. In this embodiment, a sputtering method was used to form a laminate of a tantalum nitride film (thickness of 50 nm) and a tantalum film (thickness of 250 nm), and the gate wiring line (including the gate electrode) 102 having the laminate structure was formed by using a photolithography method of a well-known patterning technique.

Next, a silicon nitride oxide film ($SiN_xB_yO_z$) 103a having a thickness of 1 to 1000 nm, preferably 10 to 100 nm and containing boron was formed (FIG. 1A). In this embodiment, sputtering using a target of single crystal silicon added with boron was carried out in an atmosphere containing nitric oxide gas (here, dinitrogen oxide gas), so that the silicon nitride oxide film ($SiN_xB_yO_z$) having a thickness of 50 nm was formed. The silicon nitride oxide film ($SiN_xB_yO_z$) may be formed by using a sputtering method employing a target of single crystal silicon in an atmosphere using a nitric oxide gas and diborane ($B_2H_6$). Since the thus obtained silicon nitride oxide film ($SiN_xB_yO_z$) contains boron of 0.1 to 50 atoms %, the film has high thermal conductivity and has an effect to prevent deterioration of characteristics due to heat of a semiconductor device. Further, since this silicon nitride oxide film has a blocking effect to movable ions such as sodium, it has also an effect to prevent these ions from intruding into the semiconductor device, especially into a channel formation region from the substrate or the like.

Next, an insulating film 103b and an amorphous semiconductor film 104 were sequentially formed without opening to the air (FIG. 1B). In this embodiment, the silicon oxide film 103b (thickness of 125 nm) was formed so to make a laminate by a plasma CVD method, so that a gate insulating film of laminate structure was formed. In this embodiment, although the two-layer insulating film is adopted as the gate insulating film, a single layer or a laminate layer of not less than three layers may be adopted. Besides, in this embodiment, a noncrystalline silicon film (amorphous silicon film) having a thickness of 54 nm was formed as the amorphous semiconductor film 104 on the gate insulating film by a plasma CVD method. Incidentally, in order to prevent adhesion of a pollutant from the air to the interface of any layers, laminate formation was sequentially made without opening to the air. Thereafter, a heat treatment (500° C., 1 hour) for reducing the concentration of hydrogen in the amorphous silicon film, which blocked crystallization of the semiconductor film, was carried out.

After the state of FIG. 1B was obtained in this way, crystallization (laser crystallization) by irradiation of infrared light or ultraviolet light was carried out to the amorphous semiconductor film 104, so that a crystalline semiconductor film (semiconductor film including crystal) 105 was formed (FIG. 1C). In the case where ultraviolet light is used for the crystallizing technique, excimer laser light or intense light generated from an ultraviolet lamp may be used. In the case where infrared light is used, infrared laser light or intense light generated from an infrared lamp may be used. In this embodiment, KrF excimer laser light was shaped into a linear beam and was irradiated. The irradiation condition was such that the pulse frequency was 30 Hz, the overlap ratio was 96%, and the laser energy density was 100 to 500 $mJ/cm^2$ and was 360 $mJ/cm^2$ in this embodiment. The condition (wavelength of laser light, overlap ratio, irradiation strength, pulse width, repetitive frequency, irradiation time, etc.) of laser crystallization may be suitably determined by an operator in view of the thickness of the amorphous semiconductor film 104, substrate temperature, and the like. According to the condition of laser crystallization, there is a case where an initial semiconductor film is crystallized through a melted state, or a case where an initial semiconductor film is not melted but is crystallized in a solid state or an intermediate state between a solid phase and a liquid phase. By this step, the amorphous semiconductor film 104 is crystallized, so that it is transformed into the crystalline semiconductor film 105. In this embodiment, the crystalline semiconductor film is a polycrystal silicon film (polysilicon film).

Figure 1D:
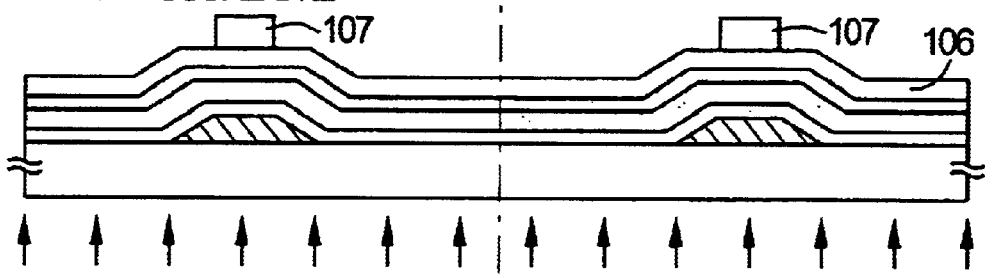

Next, an insulating film (subsequently serving as a channel protecting film) 106 for protecting a channel formation region was formed on the thus formed crystalline semiconductor 105. In this embodiment, a silicon oxide film (thickness of 200 nm) was formed. Next, by patterning (film formation of a resist mask, exposure, and development) using exposure from the back surface, a resist mask 107 was formed to be in contact with the insulating film 106 (FIG. 1D). Since the formation of the resist mask by exposure from the back surface does not require a mask, the number of masks for fabrication can be reduced. As shown in the drawing, the size of the resist mask became slightly smaller than the width of the gate wiring line by bending of light toward the inside.

Figure 1E:
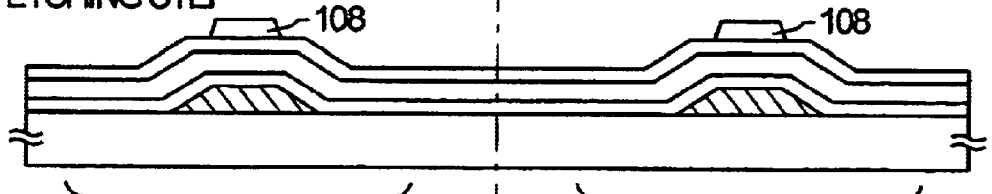

Next, after the insulating film 106 was etched by using the resist mask 107 as a mask to form a channel protecting film 108, the resist mask 107 was removed (FIG. 1E). By this step, the surface of the crystalline silicon film other than the region which was in contact with the channel protecting film 108 was exposed. This channel protecting film 108 serves to prevent a dopant from being added to the region which becomes the channel formation region in a subsequent doping step. In this embodiment, although the silicon oxide film was used as the channel protecting film 108, such a structure may be adopted that the silicon nitride oxide film ($SiN_xB_yO_z$) containing boron according to the present invention is used instead of the silicon oxide film to prevent deterioration of characteristics due to heat of the semiconductor device.

Figure 2A:
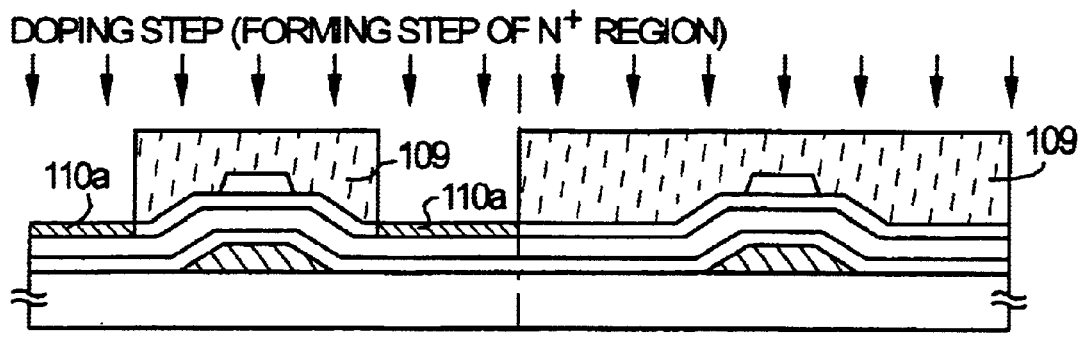
FIGS. 2A to 2D are explanatory views of fabricating steps of the TFT of Embodiment 1.

Next, a resist mask 109 covering a part of an n-channel TFT or a p-channel TFT was formed by patterning using a photomask, and a step of adding an impurity to give an n type to the crystalline semiconductor film was carried out, so that a first impurity region (n$^+$ region) 110a was formed (FIG. 2A). In this embodiment, phosphorus was used as the impurity to give the n type conductivity. As a doping gas, phosphine (PH$_3$) diluted with hydrogen to 1 to 10% (in this embodiment, 5%) was used, and the dose amount was made 5×10$^{14}$ atoms/cm$^2$, and the acceleration voltage was made 10 kV. Further, when an operator suitably sets the pattern of the resist mask 109, the width of the n$^+$ region is determined, and it is possible to relatively easily obtain the n$^+$ region having a desired width and the channel formation region.

Figure 2B:
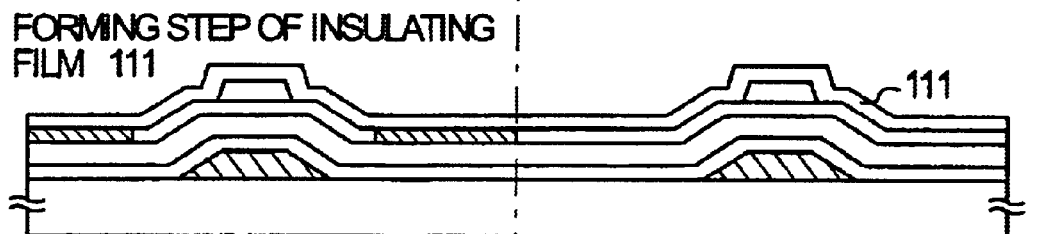

Next, after the resist mask 109 was removed, an insulating film 111 for forming an LDD region was formed (FIG. 2B). In this embodiment, as the insulating film 111, a silicon oxide film (thickness of 50 nm) was formed by a plasma CVD method. Although the silicon oxide film was used as the insulating film 111 in this embodiment, such a structure may be adopted that the silicon nitride oxide film (SiN$_x$B$_y$O$_z$) containing boron according to the present invention is used to prevent deterioration of characteristics due to heat of the semiconductor device.

Figure 2C:
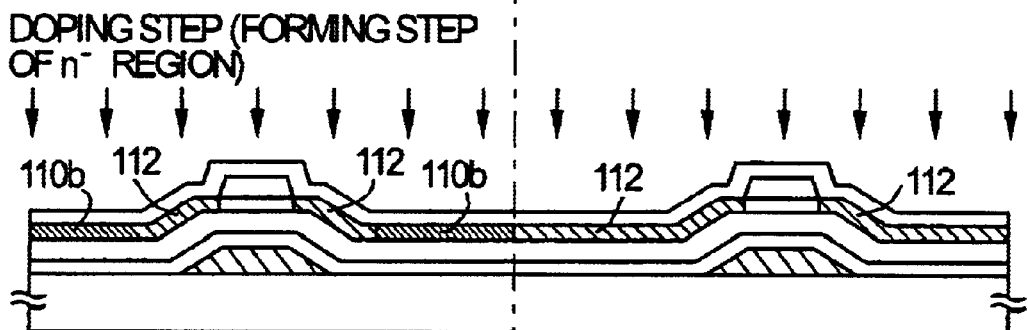

Next, a step of adding an impurity element to give the n type to the crystalline semiconductor film with its surface on which the insulating film 111 was provided was carried out, so that a second impurity region (n$^-$ region) 112 was formed (FIG. 2C). However, since the impurity is added through the insulating film 111 to the crystalline semiconductor film thereunder, it is important to suitably set the doping condition in view of the thickness of the insulating film 111. In this embodiment, phosphine diluted with hydrogen to 1 to 10% (in this embodiment, 5%) was used as a doping gas, the dose amount was made 3×10$^{13}$ atoms/cm$^2$, and the acceleration voltage was made 60 kV. By adding the impurity element through this insulating film 111, it was possible to form the impurity region having a desired concentration (1×10$^{18}$ to 1×10$^{19}$ atoms/cm$^3$ in SIMS analysis). The thus formed second impurity region 112 functions as the LDD region. At this time, the impurity was further added so that a first impurity region 110b was formed, and an intrinsic crystalline semiconductor region remained just under the channel protecting film. However, although not shown, actually, the impurity element is slightly bent around the channel protecting film toward the inside and is added.

Figure 2D:
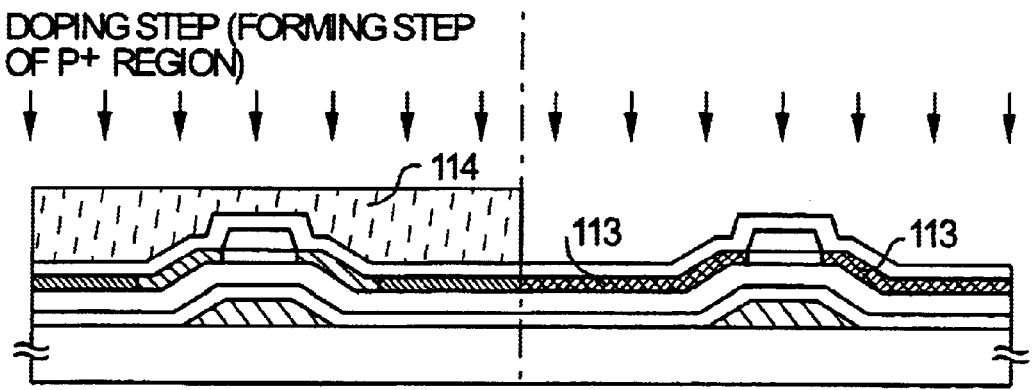

Next, a resist mask 114 covering the n-channel TFT was formed using a photomask, and a step of adding an impurity element to give a p type to the crystalline semiconductor film was carried out, so that a third impurity region (p$^-$ region) 113 was formed (FIG. 2D). In this embodiment, B (boron) was used as the impurity element to give the p type. As a doping gas, diborane (B$_2$H$_6$) diluted by hydrogen to 1 to 10% was used, and the dose amount was made 4×10$^{15}$ atoms/cm$^3$, and the acceleration voltage was made 30 kV.

Figure 3A:
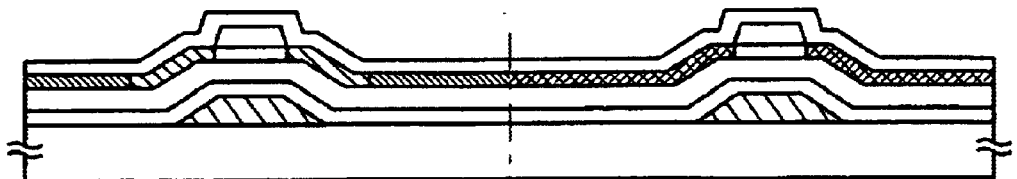
FIGS. 3A to 3D are explanatory views of fabricating steps of the TFT of Embodiment 1.
Figure 3B:
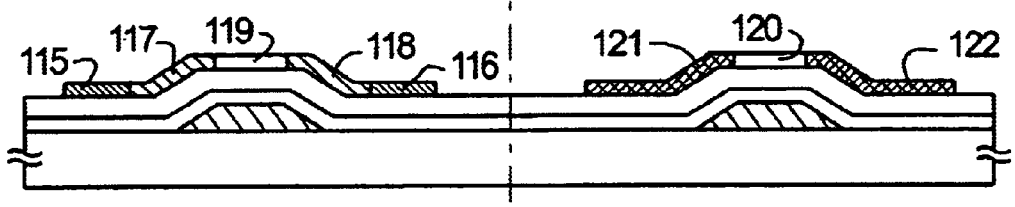

Next, the resist mask 114 was removed, and after an activation treatment of the impurity by laser annealing or thermal annealing was carried out, a heat treatment (350° C., 1 hour) was carried out in a hydrogen atmosphere, so that the whole was hydrogenated (FIG. 3A). Thereafter, an active layer having a desired shape was formed by a well-known patterning technique, and the channel protecting film 108 and the insulating film 111 covering the active layer were removed (FIG. 3B).

Through the foregoing steps, a source region 115, a drain region 116, low concentration impurity regions 117 and 118, and a channel formation region 119 of the n-channel TFT were formed, and a source region 121, a drain region 122, and a channel formation region 120 of the p-channel TFT were formed.

Figure 3C:
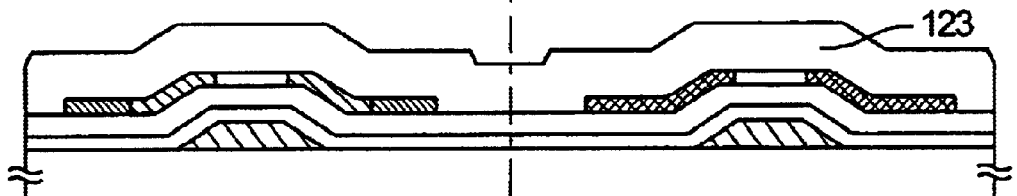

Next, an interlayer insulating film 123 of a laminate structure of a silicon oxide film having a thickness of 100 nm and formed by a plasma CVD method, and a silicon oxide film having a thickness of 940 nm and using TEOS and oxygen (O$_2$) as a raw material gas was formed to cover the n-channel TFT and the p-channel TFT (FIG. 3C). Although the silicon oxide film was used as the interlayer insulating film 123 in this embodiment, such a structure may be adopted that the silicon nitride oxide film (SiN$_x$B$_y$O$_z$) containing boron according to the present invention is used instead of the silicon oxide film to prevent deterioration of characteristics due to heat of the semiconductor device.

Figure 3D:
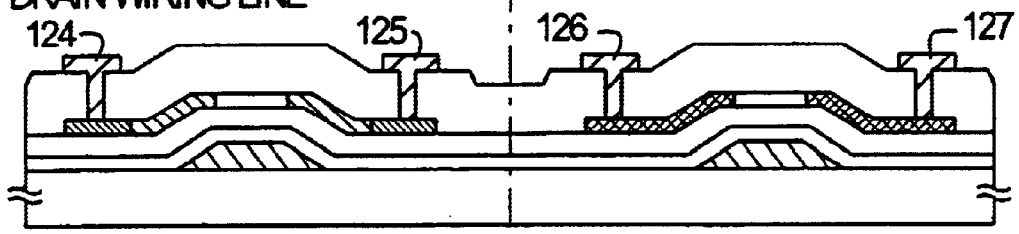

Then, contact holes were formed, and source wiring lines 124 and 126, and drain wiring lines 125 and 127 were formed, so that the state shown in FIG. 3D was obtained. Finally, a heat treatment was carried out in a hydrogen atmosphere to hydrogenate the whole, so that the n-channel TFT and the p-channel TFT were completed.

Incidentally, in this embodiment, the order of steps may be changed so that the crystallizing treatment is carried out after patterning of the amorphous semiconductor film. Besides, the order of adding steps of impurities is not limited to this embodiment, but an operator may suitably change the order of adding steps of impurities to form the impurity regions.

Embodiment 2

In Embodiment 1, the amorphous silicon film was crystallized by laser light. In this embodiment, a description will be made on an example in which crystallization of an amorphous semiconductor film is carried out by a method different from Embodiment 1. This embodiment will be described below with reference to FIGS. 4A to 6D.

First, a gate electrode 102 and gate insulating films 103a and 103b were formed on a substrate 101 similarly to Embodiment 1 (FIG. 4A). Since steps up to this are the same as Embodiment 1, the same reference numerals are used. The gate insulating film 103a is a silicon nitride oxide film (SiN$_x$B$_y$O$_z$) containing boron.

Next, in accordance with Embodiment 1, an amorphous silicon film 104a was formed. Next, by irradiation of UV light in an oxygen atmosphere, a not-shown very thin oxide film was formed on the surface of the amorphous silicon film 104a. This oxide film has a function to improve wettability of a solution containing nickel applied later.

Next, the solution containing nickel was applied to the surface of the amorphous silicon film 104a. The nickel content (in terms of weight) may be 0.1 to 50 ppm, preferably 1 ppm to 30 ppm. This value is set so that the concentration of nickel in the amorphous silicon film 104a is made the order of 10$^{15}$ to 10$^{19}$ atoms/cm$^3$. If the concentration is not higher than 10$^{15}$ atoms/cm$^3$, the catalytic function of nickel can not be obtained. If the concentration is about 10$^{19}$ atoms/cm$^3$, it is possible to fabricate an operable TFT even in the case where gettering is not carried out, and this is also for effectively carrying out the gettering step. Incidentally, the concentration of nickel is defined as a maximum value of measurement values by SIMS.

In this embodiment, a nickel acetate solution containing nickel of 10 ppm was applied. Then, the substrate 101 was rotated by a spin coater to blow off and remove the surplus nickel acetate solution, so that a very thin nickel containing layer 205 was formed on the surface of the amorphous silicon film 104a (FIG. 4B).

After the state shown in FIG. 4B was obtained, a heat treatment at a temperature of 550° C. for 4 hours was carried out in a nitrogen atmosphere, so that the amorphous silicon film 104a was crystallized. By this crystallizing step, a crystalline silicon film 204b was obtained. Since this crystal growth proceeds from the surface of the amorphous silicon film 104a to which nickel was added toward the substrate 101 (vertical direction), this crystal growth will be referred to as "vertical growth" in this specification (FIG. 4C). Incidentally, in this embodiment, although the nickel containing layer is formed on the whole surface, such a structure may be adopted that the nickel containing layer is selectively formed using a resist or the like, so that crystallization proceeds in the direction parallel to the substrate surface (lateral direction).

Although a polycrystal silicon film containing crystal grains is formed if film formation is made in accordance with this crystallizing step, a silicon film of a microcrystal state can be formed according to different conditions.

The heat treatment can be made in an electronic furnace at 500 to 700° C., preferably 550 to 650 ° C. At this time, it is necessary that the upper limit of the heating temperature is made lower than the glass distortion point of the glass substrate 101 used. If the temperature exceeds the glass distortion point, a warp, a shrinkage, or the like of the glass substrate becomes tangible. It is sufficient if the heating time is made about 1 to 12 hours. This heat treatment is carried out by furnace annealing (heat treatment in an electronic furnace). Heating means such as lamp annealing can also be used.

Next, irradiation of laser light was carried out to the obtained crystalline silicon film 204b, so that a crystalline silicon film 204c with improved crystallinity was obtained. In this embodiment, a pulse oscillation type KrF excimer laser (wavelength of 248 nm) was used (FIG. 4D). Incidentally, the very thin oxide film formed to improve the wettability of the solution may be removed prior to the irradiation of laser light.

As a pulse oscillation type laser, a XeCl excimer laser of a short wavelength (ultraviolet region), a YAG laser of a long wavelength, or the like is used. Since the excimer laser used in this embodiment oscillates ultraviolet light, instantaneous melting and solidification is repeated in an irradiated region. Thus, a kind of nonequilibrium state is formed by irradiation of excimer laser light, and a state where nickel can move very easily is obtained.

In the crystalline silicon film 204b obtained in the crystallizing step shown in FIG. 4C, amorphous components remain irregularly. However, by the irradiation of laser light shown in FIG. 4D, such amorphous components can be completely crystallized, so that the crystallinity of the crystalline silicon film 204c is greatly improved.

Although this laser irradiation step can be omitted, an effect to improve efficiency of a subsequent gettering step, in addition to the improvement in crystallinity, can be obtained by the laser irradiation. After the laser irradiation, the maximum value of the concentration of remaining nickel by SIMS is about $1 \times 10^{19}$ to $2 \times 10^{19}$ atoms/cm$^3$.

A gettering technique (Japanese Patent Application Laid-open No. Hei. 10-270363) to remove or reduce a catalytic element remaining in the crystalline silicon film may be used. The publication discloses a technique of carrying out a heat treatment (300 to 700° C., 1 to 12 hours) after phosphorus is added to the whole surface or selectively. Alternatively, a method with a liquid phase using high temperature sulfuric acid, a method with a vapor phase containing a halogen element, or a method of adding boron and heating may be used.

Next, similarly to the step shown in FIG. 1D of Embodiment 1, an insulating film (subsequently serving as a channel protecting film) 206 having a thickness of 200 nm and protecting a channel formation region was formed on the crystalline semiconductor 204c. Although the silicon oxide film was used as the insulating film 206 in this embodiment, such a structure may be adopted that instead of the silicon oxide film, the silicon nitride oxide film ($SiN_xB_yO_z$) containing boron according to the present invention is used to prevent deterioration of characteristics due to heat of the semiconductor device. Next, by patterning with exposure from the back surface, a resist mask 207 was formed to be in contact with the insulating film 206 (FIG. 4E).

Next, the insulating film 206 was etched by using the resist mask 207 as a mask, and after a channel protecting film 208 was formed, the resist mask 207 was removed (FIG. 4F).

Figure 5A:
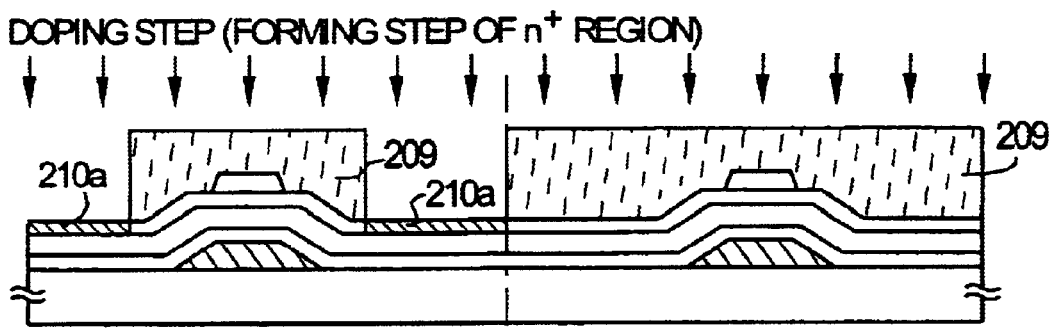
FIGS. 5A to 5D are explanatory views of fabricating steps of the TFT of Embodiment 2.

Next, a resist mask 209 covering a part of an n-channel TFT or a p-channel TFT was formed by patterning with a photomask, and a step of adding an impurity element (phosphorus) to give an n type to the crystalline semiconductor film the surface of which was exposed was carried out, so that a first impurity region (n$^+$ region) 210a was formed (FIG. 5A). In this embodiment, phosphine (PH$_3$) diluted with hydrogen to 1 to 10% (in this embodiment, 5%) was used as a doping gas, the dose amount was made $5 \times 10^{14}$ atoms/cm$^2$, and the acceleration voltage was made 10 kV.

Figure 5B:
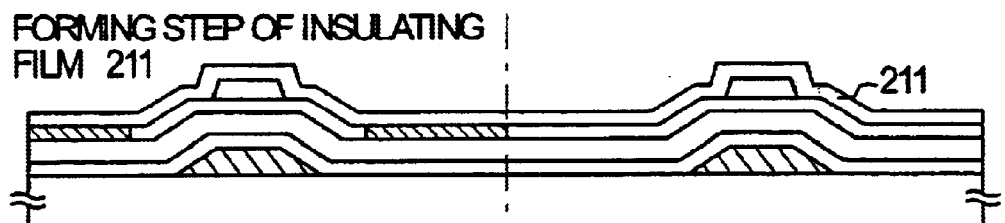

Next, after the resist mask 209 was removed, a control insulating film (in this embodiment, a silicon oxide film having a thickness of 50 nm) 211 for forming an LDD region was formed (FIG. 5B). In this embodiment, although the silicon oxide film was used as the control insulating film 211, such a structure may be used that instead of the silicon oxide film, the silicon nitride oxide film ($SiN_xB_yO_z$) containing boron according to the present invention is used to prevent deterioration of characteristics due to heat of the semiconductor device.

Figure 5C:
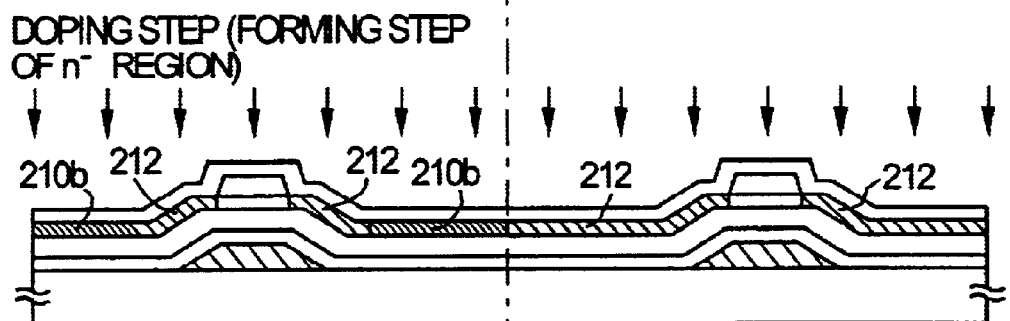

Next, a step of adding an impurity to give an n type to the crystalline semiconductor film with the surface on which the control insulating film 211 was provided was carried out, so that a second impurity region (n$^-$ region) 212 was formed (FIG. 5C). In this embodiment, phosphine (PH$_3$) diluted with hydrogen to 1 to 10% (in this embodiment, 5%) was used as a doping gas, the dose amount was made $3 \times 10^{13}$ atoms/cm$^2$, and the acceleration voltage was made 60 kV. By adding the impurity element through this control insulating film 211, it was possible to form the impurity region of a desired concentration ($1 \times 10^{18}$ to $1 \times 10^{19}$ atoms/cm$^3$ by SIMS analysis). The second impurity region 212 formed in this way functions as an LDD region. At this time, the impurity was further added to form a first impurity region 210b, and an intrinsic crystalline semiconductor region remained just under the channel protecting film.

Figure 5D:
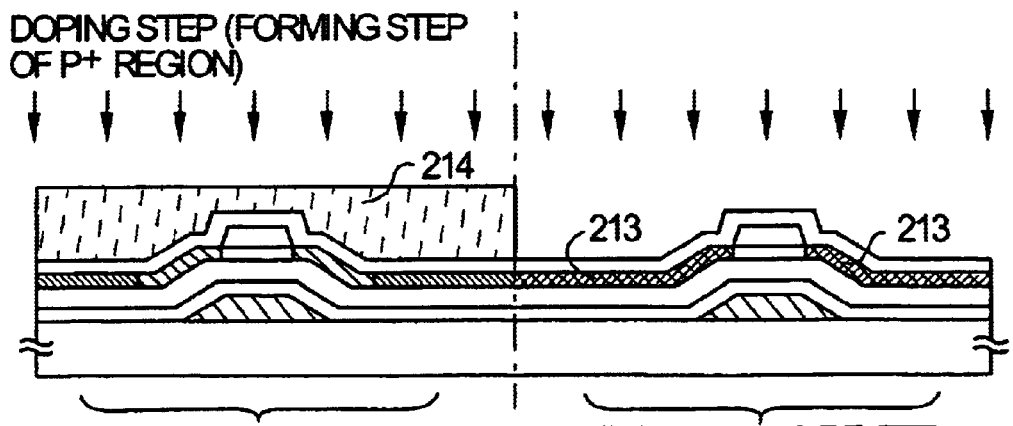

Next, a resist mask 214 covering the n-channel TFT was formed by using a photomask, and a step of adding an impurity to give a p type to the crystalline semiconductor film was carried out, so that a third impurity region (p$^+$ region) 213 was formed (FIG. 5D). In this embodiment, diborane (B$_2$H$_6$) diluted with hydrogen to 1 to 10% was used as a doping gas, the dose amount was made $4 \times 10^{15}$ atoms/cm$^2$, and the acceleration voltage was made 30 kV.

Figure 6A:
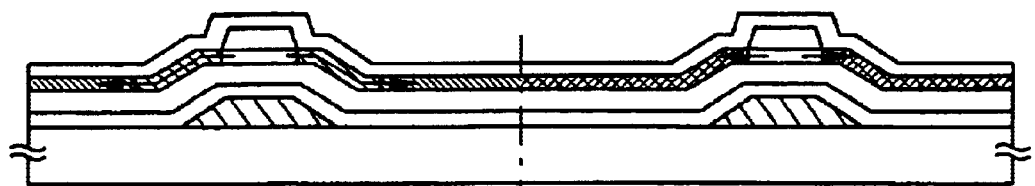
FIGS. 6A to 6D are explanatory views of fabricating steps of the TFT of Embodiment 2.

Next, the resist mask 214 was removed, a heat treatment at 300 to 700° C. for 1 to 12 hours was carried out, and a technique to lower the concentration of nickel (Japanese Patent Application Laid-open No. Hei. 8-330602) was applied to this embodiment. In this embodiment, a heat treatment at 600° C. for 8 hours was carried out, so that nickel remaining in the inside of the LDD region and the channel formation region was moved to a high concentration impurity region (source region and drain region) (FIG. 6A).

In this way, the channel formation region in which the concentration of nickel is lowered ($1\times10^{18}$ atoms/cm$^3$ or less, preferably $1\times10^{16}$ atoms/cm$^3$ or less by SIMS analysis) is obtained. At the same time as the lowering of the catalytic element by this heat treatment, recovery of damage of crystallinity at the time of doping and an activation treatment of the impurities by thermal annealing are carried out. In addition, furnace annealing, laser annealing, or lamp annealing may be carried out. Thereafter, a heat treatment (350° C., 1 hour) was carried out in a hydrogen atmosphere, so that the whole was hydrogenated.

Figure 6B:
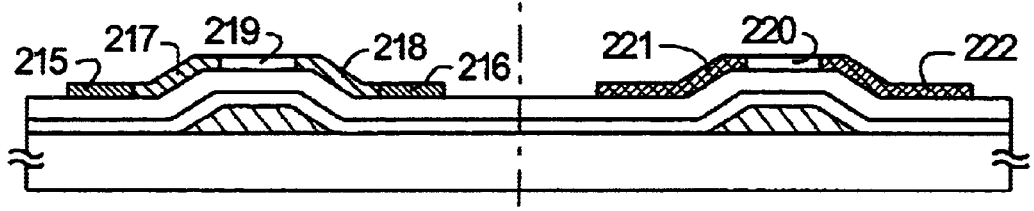

Thereafter, an active layer having a desired shape was formed by a well-known patterning technique, and the insulating film 211 and the channel protecting film 208 were removed (FIG. 6B).

Through the foregoing steps, a source region 215, a drain region 216, low concentration impurity regions 217 and 218, and a channel formation region 219 of the n-channel TFT were formed, and a source region 221, a drain region 222, and a channel formation region 220 of the p-channel TFT were formed.

Figure 6C:
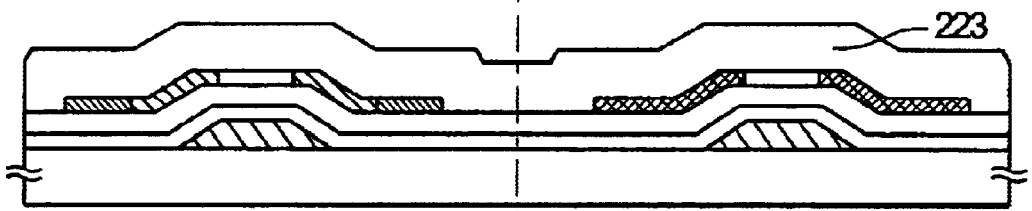

Next, an interlayer insulating film 223 of a laminate structure of a silicon oxide film having a thickness of 100 nm and formed by a plasma CVD method, and a silicon oxide film having a thickness of 940 nm and formed by using TEOS and oxygen ($O_2$) as a raw material gas was formed to cover the n-channel TFT and the p-channel TFT (FIG. 6C). In this embodiment, although the silicon oxide film was used as the interlayer insulating film 223, such a structure may be adopted that the silicon nitride oxide film ($SiN_xB_yO_z$) containing boron according to the present invention is used instead of the silicon oxide film to prevent deterioration of characteristics due to heat of the semiconductor device.

Figure 6D:
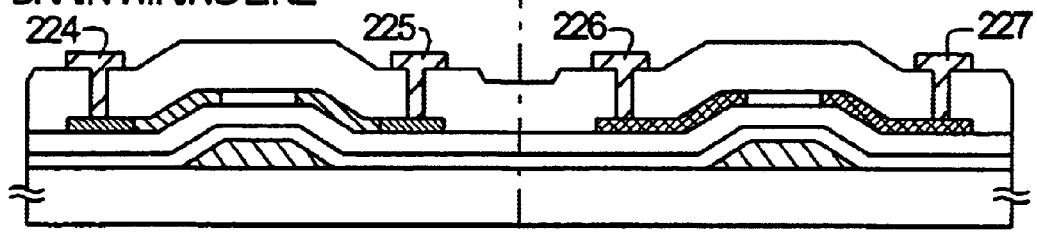

Then, contact holes were formed, and source wiring lines 224 and 226, and drain wiring lines 225 and 227 were formed, so that the state shown in FIG. 6D was obtained. Finally, a heat treatment was carried out in a hydrogen atmosphere to hydrogenate the whole, so that the n-channel TFT and the p-channel TFT were completed.

Embodiment 3

An example of a semiconductor device including an n-channel TFT and a p-channel TFT using the fabricating steps of Embodiment 1 or Embodiment 2 will be described with reference to FIGS. 7A to 7C and FIGS. 8A and 8C.

Figure 7A:
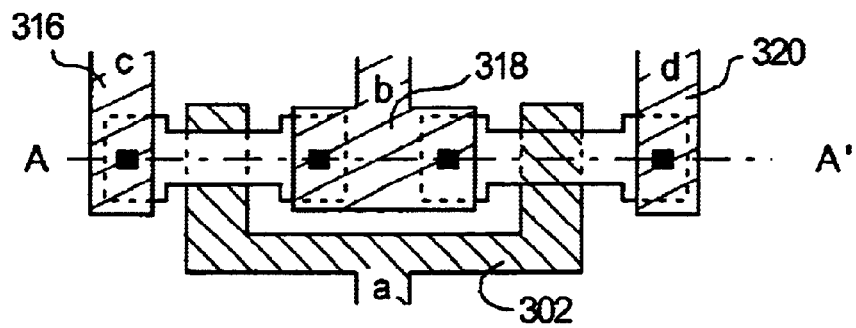
FIGS. 7A to 7C are explanatory views of a top view, a sectional view, and a circuit view of a CMOS circuit of Embodiment 3.
Figure 7B:
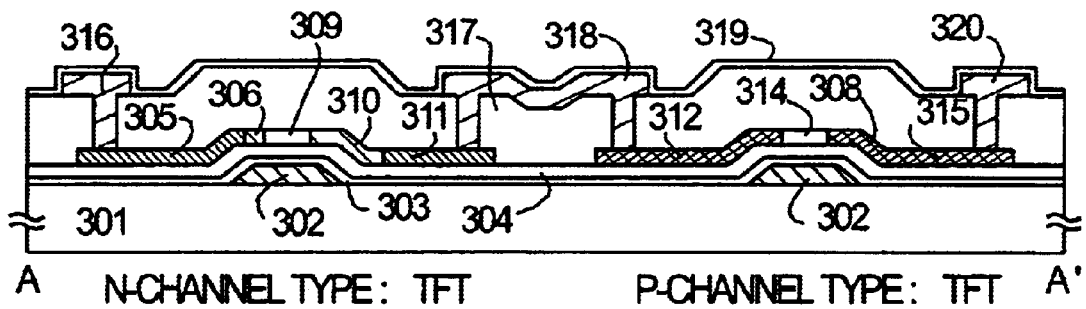
Figure 7C:
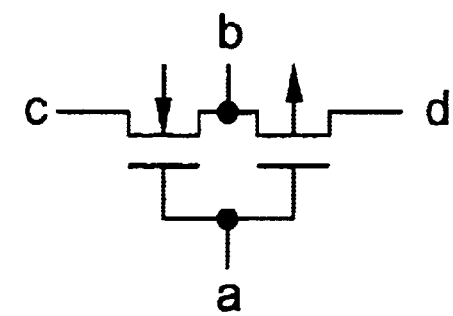
Figure 8A:
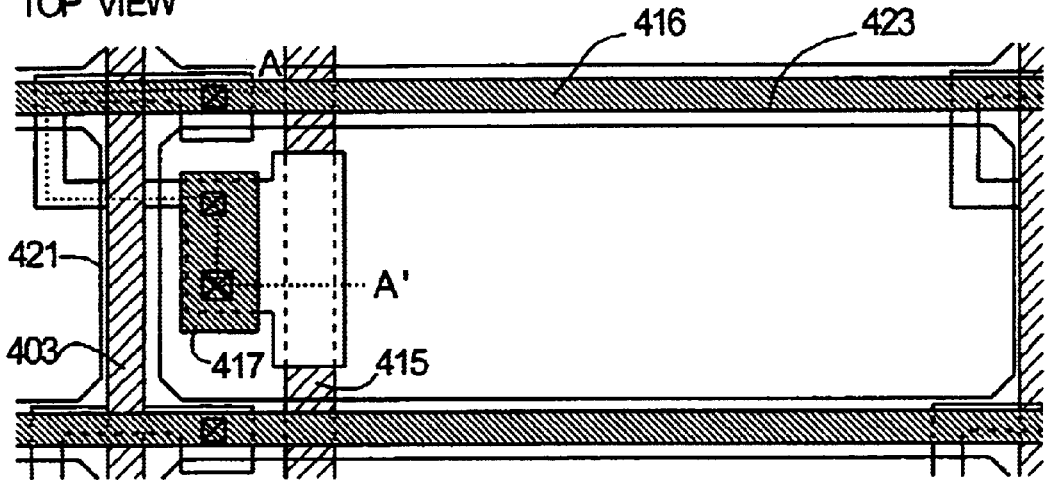
FIGS. 8A and 8B are explanatory views of a top view and a sectional view of a pixel matrix circuit of Embodiment 3.
Figure 8B:
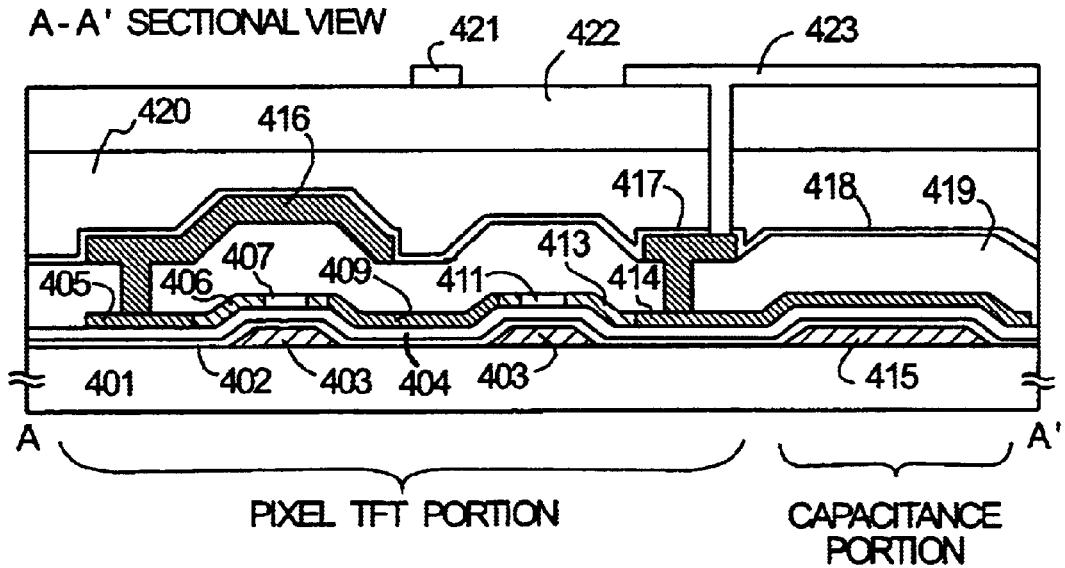

The semiconductor device of this embodiment of the present invention includes a peripheral driver circuit portion and a pixel matrix circuit portion on the same substrate. In this embodiment, for simplification of illustration, a CMOS circuit constituting a part of the peripheral circuit portion is shown in FIGS. 7A to 7C, and a pixel TFT (N-channel TFT) constituting a part of the pixel matrix circuit portion is shown in FIGS. 8A and 8B. In addition to the fabricating steps of Embodiments 1 and 2, a passivation film (protecting film) 319 of 0.2 to 0.4 µm was formed. As the passivation film 319, it is preferable to make such a structure that a silicon nitride film, for example, the silicon nitride oxide film ($SiN_xB_yO_z$) containing boron is used to prevent deterioration of characteristics due to heat of the semiconductor device.

The CMOS circuit shown in FIGS. 7A to 7C is also called an inverter circuit, and is a basic circuit constituting a semiconductor circuit. By combining such inverter circuits, a basic logical circuit such as a NAND circuit or a NOR circuit can be formed, and a further complicated logic circuit can also be formed.

FIG. 7A is a view corresponding to a top view of FIG. 7B. In FIG. 7A, a portion cut along a dotted line A-A' corresponds to a sectional structure of the CMOS circuit of FIG. 7B. FIG. 7C is a circuit diagram of the inverter circuit corresponding to FIGS. 7A and 7B.

In FIG. 7B, any TFTs (thin film transistors) are formed on a substrate 301. In the case of a P-channel TFT of the CMOS circuit, a gate electrode 302 is formed, and a first insulating film 303 made of silicon nitride oxide ($SiN_xB_yO_z$) containing boron and a second insulating film 304 made of silicon oxide are provided thereon. On the second insulating film, a p$^+$ region 312 (drain region) and 315 (source region), and a channel formation region 314 are formed as an active layer. In Embodiments 1 and 2, for the purpose of decreasing the number of steps, a low concentration impurity region (LDD region) is not provided between the high concentration impurity region and the channel formation region In the P-channel TFT. However, such a region may be formed. Contact holes are formed in a first interlayer insulating film 317 covering the active layer, and wiring lines 318 and 320 are connected to the p$^+$ a regions 312 and 315, and further, the passivation film 319 is formed thereon. Although not shown for simplification, a second interlayer insulating film is further formed thereon, a leading wiring line is connected to the wiring line 320, and a third interlayer insulating film is formed to cover that.

On the other hand, in an N-channel TFT, an n$^+$ region (source region) 305, an n$^+$ region (drain region) 311, a channel formation region 309, and$^-$ regions 306 and 310 between the n$^+$ region and the channel formation region are formed as an active layer. Incidentally, the$^-$ region 310 being in contact with the drain region was formed to have a width larger than the$^-$ region 306 so that its reliability was improved. Contact holes are formed in the first interlayer insulating film 317 covering the active layer, wiring lines 316 and 318 are connected to the n$^+$ regions 305 and 311, and the passivation film 319 is further formed thereon. Although not shown for simplification, the second interlayer insulating film is further formed thereon, a leading wiring line is connected to the wiring line 316, and the third interlayer insulating film is formed to cover that. Portions other than the active layer are substantially the same as the P-channel TFT, and their explanation is omitted for simplification.

FIG. 8A is a view corresponding to a top view of FIG. 8B. In FIG. 8A, a portion cut along a dotted line A-A' corresponds to a sectional structure of a pixel matrix circuit of FIG. 8B. FIG. 8C is a circuit diagram corresponding to FIGS. 8A and 8B.

The N-channel TFT formed in the pixel matrix circuit is basically the same as the N-channel TFT of the CMOS circuit. A gate electrode 403 is formed on a substrate 401, and a first interlayer insulating film 402 made of silicon nitride oxide ($SiN_xB_yO_z$) containing boron and a second interlayer insulating film 404 made of silicon oxide are provided thereon. On the second insulating film, n$^+$ regions 405, 409 and 414, channel formation regions 407 and 411, and$^-$ regions 406 and 413 between the n$^+$ region and the channel formation region are formed as an active layer. Contact holes are formed in a first interlayer insulating film 419 covering the active layer, a wiring line 416 is connected to the n$^+$ region 405, a wiring line 417 is connected to the n$^+$ region 414, and a passivation film 418 is further formed thereon. A second interlayer insulating film 420 is formed thereon. Further, a third interlayer insulating film 422 is formed thereon, and a pixel electrode 423 made of a transparent conductive film of ITO, $SnO_2$ or the like is connected. Reference numeral 421 designates a pixel electrode adjacent to the pixel electrode 423.

A capacitance portion of the pixel matrix circuit is formed of a dielectric of the first insulating film and the second Insulating film, a capacitance wiring line 415, and the n⁺ region 414.

In this embodiment, although a transmission type LCD is fabricated as an example, the invention is not particularly limited. For example, a reflection type LCD can be fabricated if a metal material having reflectivity is used as a material of a pixel electrode, and modification of patterning of the pixel electrode, and addition/deletion of some steps are suitably carried out.

Although the gate wiring line of the pixel TFT of the pixel matrix circuit in this embodiment is made to have a double gate structure, multi-gate structure such as a triple gate structure may be employed to reduce fluctuation in off current. Besides, a single gate structure may be employed to improve an aperture ratio.

The TFT fabricated by carrying out this embodiment exhibits electrical characteristics with less fluctuation. This embodiment can be combined with Embodiment 1 or Embodiment 2.

Embodiment 4

This embodiment will be described with reference to FIGS. 9A to 9E and FIGS. 10A to 10C. In Embodiment 1 or Embodiment 2, the example in which silicon nitride oxide ($SiN_xB_yO_z$) containing boron is used as one layer of the gate insulating film of the bottom gate type TFT has been described. In this embodiment, an example in which silicon nitride oxide ($SiN_xB_yO_z$) containing boron is used as one layer of an under film of a top gate type TFT will be described.

Here, a description will be made on an example in which an n-channel TFT and a p-channel TFT are fabricated on the same substrate so that an inverter circuit as a basic structure of a CMOS circuit is formed.

As a substrate 501, a glass substrate, a plastic substrate, a ceramic substrate, or the like can be used. A silicon substrate having a surface on which an insulating film, such as a silicon oxide film or a silicon nitride oxide film, is formed, or a metal substrate typified by stainless may be used. Of course, a quartz substrate can also be used.

Then, an under film 502 made of silicon nitride oxide ($SiN_xB_yO_z$) containing boron and an under film 503 made of silicon nitride oxide were formed on the main surface of the substrate 501 on which a TFT was to be formed. In this embodiment, the silicon nitride oxide ($SiN_xB_yO_z$) 502 was formed by sputtering using a target made of single crystal silicon in an atmosphere containing argon (Ar) and diborane ($B_2H_6$). Alternatively, the silicon nitride oxide ($SiN_xB_yO_z$) may be formed by employing a sputtering method using a target of single crystal silicon added with boron in an atmosphere containing nitrogen ($N_2$) or ammonia ($NH_3$). Since the thus obtained silicon nitride oxide ($SiN_xB_yO_z$) 502 contains boron of 1 to 50 atoms %, it has high thermal conductivity and has an effect to prevent deterioration of characteristics due to heat of the semiconductor device. The under film 503 may be formed by a plasma CVD method or a sputtering method, and is provided to prevent a harmful impurity from diffusing from the substrate 501 to a semiconductor layer.

Thus, it was sufficient if the under film 502 made of silicon nitride oxide ($SiN_xB_yO_z$) containing boron was formed to a thickness of 20 to 100 nm, typically 50 nm, and further, the under film 503 made of silicon nitride oxide was formed to a thickness of 50 to 500 nm, typically 150 to 200 nm to form a laminate.

Of course, although either one of the under film 502 made of silicon nitride oxide film ($SiN_xB_yO_z$) containing boron and the under film 503 made of silicon nitride oxide may be formed as an under film, it is most desirable to form the two-layer structure in view of reliability of a TFT.

As the semiconductor layer formed to be in contact with the under film 503, it is desirable to use a crystalline semiconductor obtained by crystallizing an amorphous semiconductor formed by a film formation method, such as a plasma CVD method, a low pressure CVD method or a sputtering method, by a laser crystallizing method or a solid phase growth method through a heat treatment. It is also possible to apply a microcrystalline semiconductor formed by the film formation method. As a semiconductor material which can be applied here, silicon (Si), germanium (Ge), silicon germanium alloy or silicon carbide may be used, and in addition, a compound semiconductor material such as gallium arsenide may be used.

The semiconductor layer is formed to a thickness of 10 to 100 nm, typically 50 nm. Although hydrogen of 10 to 40 atom % is contained in the amorphous semiconductor film fabricated by the plasma CVD method, it is desirable that hydrogen is removed from the film by carrying out a heat treatment at 400 to 500° C. prior to the step of crystallization so that hydrogen content is made 5 atom % or less. Although the amorphous silicon film may be formed by another fabricating method such as a sputtering method or an evaporation method, it is desirable that an impurity element such as oxygen or nitrogen contained in the film is sufficiently lowered in advance.

Since the under film and the amorphous semiconductor film can be formed by the same forming method, it is appropriate that the under film 503 and the semiconductor layer are continuously formed. After the respective films are formed, the surfaces are not brought into contact with the air, so that pollution of the surfaces can be prevented. As a result, one of factors to generate fluctuation in characteristics of the TFT can be eliminated.

As the step of crystallizing the amorphous semiconductor film, a well-known laser crystallizing technique or a thermal crystallizing technique may be used. If the crystalline semiconductor film is formed by a technique using a catalytic element, excellent TFT characteristics can be obtained.

A resist mask was formed by a well-known patterning method using a first photomask, and the thus formed crystalline semiconductor film was subjected to a dry etching method so that island-like semiconductor layers 504 and 505 were formed.

Next, a gate insulating film 506 containing silicon oxide or silicon nitride as its main ingredient was formed on the surfaces of the island-like semiconductor layers 504 and 505. Such a structure may be adopted that silicon nitride oxide ($SiN_xB_yO_z$) containing boron is used for the gate insulating film 506 so that deterioration of characteristics due to heat of the semiconductor device is prevented. It is appropriate that the gate insulating film 506 is formed by a plasma CVD method or a sputtering method, and the thickness is made 10 to 200 nm, preferably 50 to 150 nm.

A first conductive layer 507 and a third conductive layer 508 were formed on the surface of the gate insulating film 506. The first conductive layer 507 is made of a conductive material containing an element selected from Ta, Ti, Mo, and W as its main ingredient. It is appropriate that the first conductive layer 507 is formed to a thickness of 5 to 50 nm, preferably 10 to 25 nm.

The thicknesses of the gate insulating film 506 and the first conductive layer 507 are important. This is because in a first impurity adding step carried out later, an impurity to give an n type is added to the semiconductor layers 504 and 505 through the gate insulating film 506 and the first conductive layer 507. Actually, the condition of the first impurity adding step was determined in view of the thicknesses of the gate insulating film 506 and the conductive layer 507. Here, because if the thickness of the gate insulating film 506 or the first conductive layer 507 is changed by 10% or more of the predetermined value, the concentration of the added impurity is lowered.

Figure 9A:
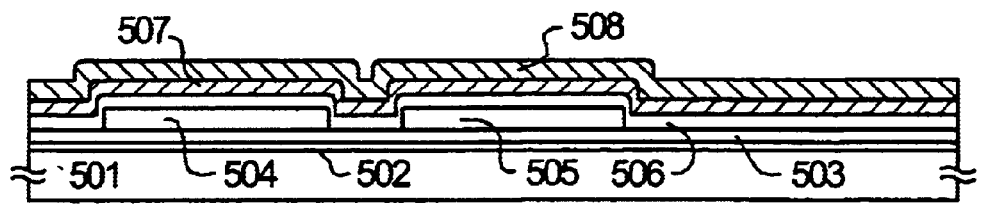
FIGS. 9A to 9E are explanatory views of fabricating steps of a TFT of Embodiment 4.

As the third conductive layer 508, a conductive material containing Al or Cu as its main ingredient is used. For example, in the case where Al is used, an Al alloy added with an element of 0.1 to 5 atom %, which is selected from Ti, Si, and Sc, may be used. It is appropriate that the third conductive layer is formed to a thickness of 100 to 1000 nm, preferably 200 to 400 nm. This is formed as a wiring material to lower wiring resistance of a gate wiring line or gate bus line (FIG. 9A).

In the present invention, the gate wiring line is a wiring line which is formed on the gate insulating film 506, is made of the same material as a gate electrode, and is connected to the gate electrode. The gate bus line is also regarded as a part of the gate wiring line from the structure where it is connected to the gate electrode.

Figure 9B:
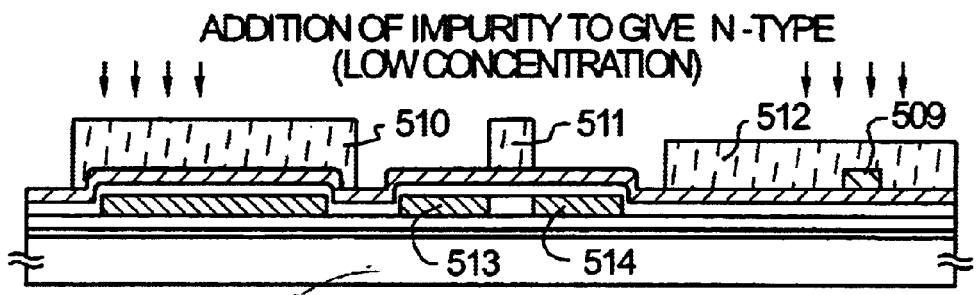

Next, a resist mask was formed by using a second photomask, and an unnecessary portion of the third conductive layer was removed, so that a part of the gate bus line was formed (509 in FIG. 9B). In the case where the third conductive layer was Al, it was possible to remove the conductive layer with good selectivity to the under film of the first conductive layer by a wet etching method using a phosphoric acid solution.

Then, by a third photomask, resist masks 510 and 511 covering the semiconductor layer 504 and a channel formation region of the semiconductor layer 505 were formed. At this time, a resist mask 512 may also be formed in a region where a wiring line is formed.

Then, a step of adding a first impurity element to give an n type was carried out. As an impurity element to give the n type to a crystalline semiconductor material, phosphorus (P), arsenic (As), antimony (Sb) or the like is known. Here, phosphorus was used, and an ion doping method using phosphine ($PH_3$) was carried out. In this step, for the purpose of adding phosphorus through the gate insulating film 506 and the first conductive film 507 to the semiconductor layer thereunder, the acceleration voltage was set as high as 80 keV. It is preferable that the concentration of phosphorus added to the semiconductor layer is within the range of $1\times10^{16}$ to $1\times10^{19}$ atoms/$cm^3$, and here, it was made $1\times10^{18}$ atoms/$cm^3$. Then, regions 513 and 514 where phosphorus was added to the semiconductor layer were formed. A part of the region added with phosphorus and formed here is made a second impurity region functioning as an LDD region (FIG. 9B).

Figure 9C:
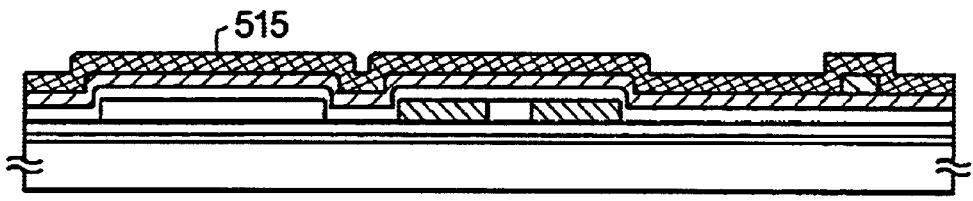

Thereafter, the resist masks 510, 511, and 512 were removed, and a second conductive layer 515 was formed on the whole surface. The second conductive layer 515 may be formed of the same material as the first conductive layer 507, and a conductive material containing an element selected from Ta, Ti, Mo, and W as its main ingredient is used. It is appropriate that the second conductive layer is formed to a thickness of 100 to 1000 nm, preferably 200 to 500 nm (FIG. 9C).

Next, resist masks 516, 517, 518 and 519 were formed by a fourth photomask. The fourth photomask was for forming a gate electrode, a gate wiring line, and a gate bus line of the p-channel TFT. Since the gate electrode of the n-channel TFT was formed in a subsequent step, the resist mask 517 was formed so that a first conductive layer 522 and a second conductive layer 523 remained on the semiconductor layer 505.

Unnecessary portions of the first conductive layer and the second conductive layer were removed by a dry etching method. Then, gate electrodes 520 and 521, gate wiring lines 524 and 525, and gate bus lines 526 and 527 were formed.

The gate bus line was formed as a clad type structure in which the third conductive layer 509 was covered with the first conductive layer 526 and the second conductive layer 527. The third conductive layer was a low resistance material containing Al or Cu as its main ingredient, and it was possible to lower the wiring resistance.

A step of adding a third impurity element to give a p type was carried out to a part of the semiconductor layer where the p-channel TFT was to be formed, while the resist masks 516, 517, 518 and 519 were made to remain as they were. As the impurity element to give the p type, boron (B), gallium (Ga) or the like is known, and here, boron was used as the impurity element, and was added by an ion doping method using diborane ($B_2H_6$). Also here, the acceleration voltage was made 80 keV, and boron was added at a concentration of $2\times10^{20}$ atoms/$cm^3$. Then, third impurity regions 552 and 553 where boron was added at a high concentration were formed as shown in FIG. 9D.

Figure 9D:
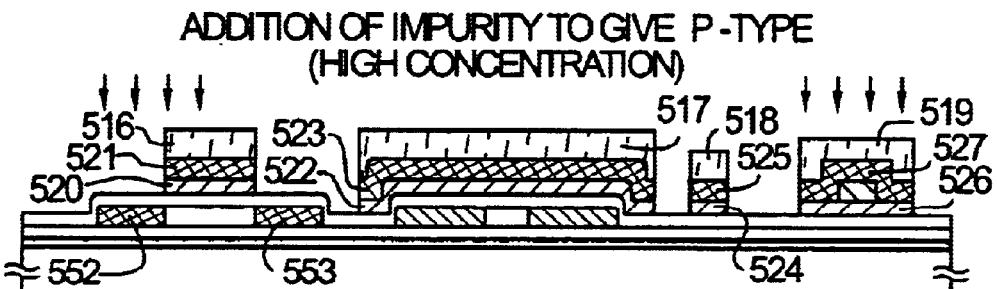
Figure 9E:
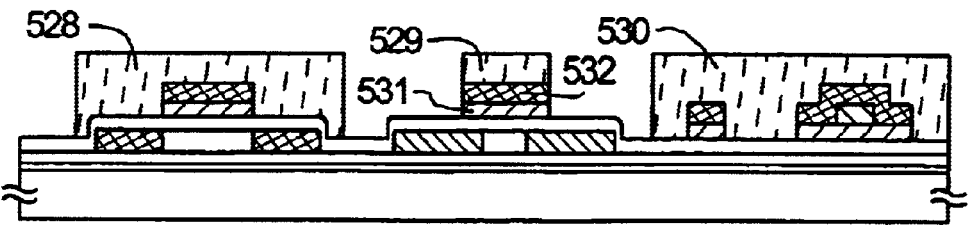

After the resist masks provided in FIG. 9D were removed, resist masks 528, 529 and 530 were newly formed by a fifth photomask. The fifth photomask was for forming a gate electrode of the n-channel TFT, and gate electrodes 531 and 532 were formed by a dry etching method. At this time, the gate electrodes 531 and 532 were formed to overlap with part of the second impurity regions 513 and 514 (FIG. 9E).

After the resist masks 528, 529 and 530 were completely removed, resist masks 533, 534 and 535 were formed. The resist mask 534 was formed to cover the gate electrodes 531 and 532 of the n-channel TFT and part of the second impurity region. The resist mask 534 determined the offset amount of the LDD region.

Figure 10A:
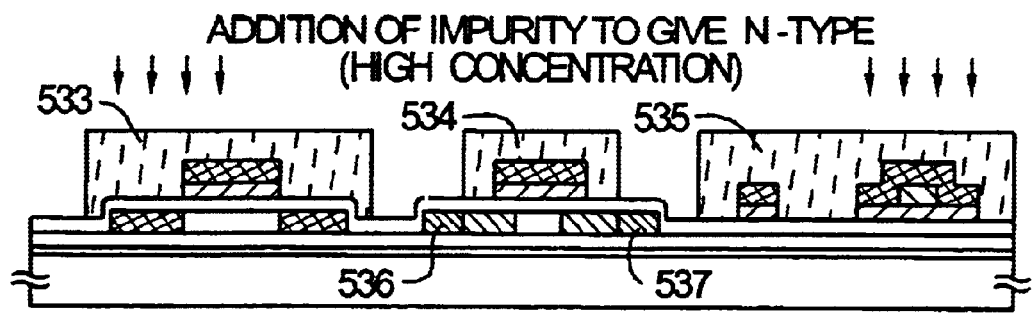
FIGS. 10A to 10C are explanatory views of fabricating steps of the TFT of Embodiment 4 and a top view.

Then, a step of adding a second impurity element to give an n type was carried out. As a result, a first impurity region 537 which became a source region and a first impurity region 536 which became a drain region were formed. Here, an ion doping method using phosphine was carried out. Also in this step, for the purpose of adding phosphorus through the gate insulating film 506 to the semiconductor layer thereunder, the acceleration voltage was set as high as 80 keV. The concentration of phosphorus in this region is high as compared with the step of adding the first impurity element to give the n type, and it is preferable to make the concentration $1\times10^{19}$ to $1\times10^{21}$ atoms/$cm^3$, and here, the concentration was made $1\times10^{20}$ atoms/$cm^3$ (FIG. 10A).

Then, first interlayer insulating films 538 and 550 were formed on the surfaces of the gate insulating film 506, the gate electrodes 520, 521, 531 and 532, the gate wiring lines 524 and 525, and the gate bus lines 526 and 527. The first interlayer insulating film 550 was a silicon nitride oxide film and was formed to a thickness of 50 nm. The first interlayer insulating film 538 was a silicon oxide film and was formed to a thickness of 950 nm. Besides, such a structure may be adopted that a silicon nitride oxide film ($SiN_xB_yO_z$) containing boron is used as the first interlayer insulating film 550, so that deterioration of characteristics due to heat of the semiconductor device is prevented.

The first interlayer insulating film 550 made of silicon nitride oxide formed here was necessary for carrying out a next heat treatment. This was effective to prevent the surfaces of the gate electrodes 520, 521, 531 and 532, the gate wiring lines 524 and 525, and the gate bus lines 526 and 527 from being oxidized.

It was necessary to carry out the step of the heat treatment in order to activate the impurity elements to give the n type or p type added at each concentration. This step may be carried out by a thermal annealing method using an electronic furnace, the laser annealing method using the excimer laser, or a rapid thermal annealing method (RTA method) using a halogen lamp. However, in the laser annealing method, although activation can be made at a low substrate heating temperature, it has been difficult to make activation up to a region concealed under the gate electrode. Thus, here, the step of activation was made by the thermal annealing method. The heat treatment was carried out in a nitrogen atmosphere at 300 to 700° C., preferably 350 to 550° C., here, 450° C. for 2 hours.

After a predetermined resist mask was formed by using a seventh photomask, the first interlayer insulating films 538 and 550 were subjected to an etching treatment, so that contact holes reaching the source region and the drain region of each of the TFTs were formed. Then, source electrodes 539 and 540 and a drain electrode 541 were formed. Although not shown, in this embodiment, each of the electrodes was used as a three-layer electrode in which a Ti film having a thickness of 100 nm, an Al film containing Ti and having a thickness of 300 nm, and a Ti film having a thickness of 150 nm were continuously formed by a sputtering method.

Through the foregoing steps, a channel formation region 545, first impurity regions 548 and 549, and second impurity regions 546 and 547 were formed in the n-channel TFT of the CMOS circuit. Here, in the second impurity regions, regions (GOLD regions) 546a and 547a overlapping with the gate electrode and regions (LDD regions) 546b and 547b not overlapping with the gate electrode were formed, respectively. The first impurity region 548 became a source region, and the first impurity region 549 became a drain region.

Figure 10B:
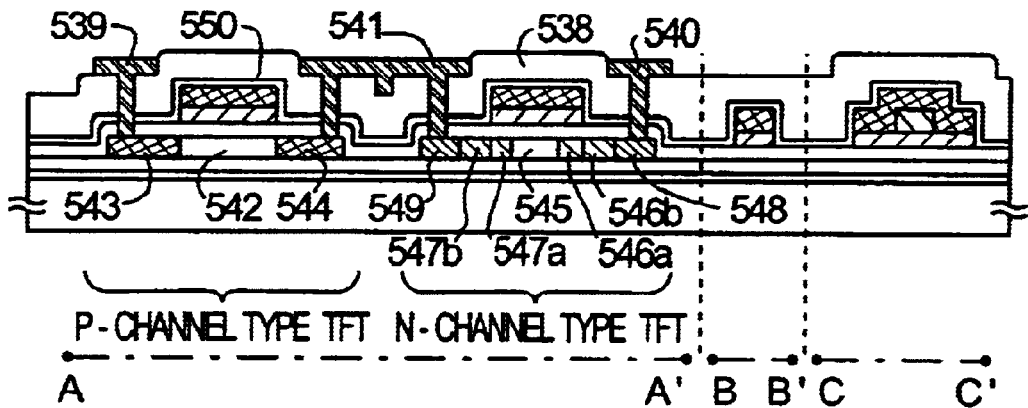

On the other hand, In the p-channel TFT, a channel formation region 542, and third impurity regions 543 and 544 were formed. The third impurity region 543 became a source region, and the third impurity region 544 became a drain region (FIG. 10B).

Figure 10C:
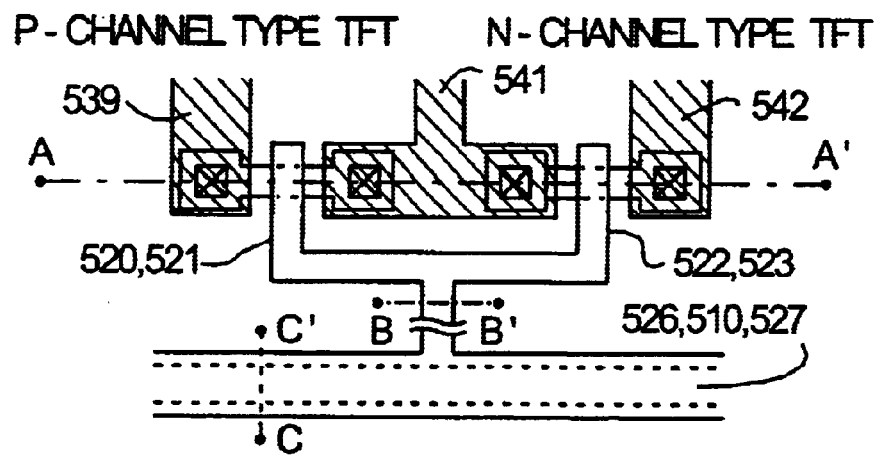

FIG. 10C is a top view showing an inverter circuit. An A-A' sectional structure of a TFT portion, a B-B' sectional structure of a gate wiring line portion, and a C-C' sectional structure of a gate bus line portion correspond to FIG. 10B. In the present invention, the gate electrode and the gate wiring line are formed of the first conductive layer and the second conductive layer, and the gate bus line has a clad structure formed of the first conductive layer, the second conductive layer, and the third conductive layer.

In FIGS. 9A to 9E and FIGS. 10A to 10C, although the CMOS circuit formed by complementarily combining the n-channel TFT and the p-channel TFT is shown as an example, the present invention can also be applied to an NMOS circuit using an n-channel TFT or a pixel matrix substrate of a liquid crystal display device.

Embodiment 5

In this embodiment, a description will be made on an example in which a crystalline semiconductor film used as the semiconductor layers 504 and 505 in Embodiment 4 is formed by a thermal crystallization method using a catalytic element. In the case of using the catalytic element, it is desirable to use a technique disclosed in Japanese Patent Application Laid-open No. Hei. 7-130652 or No. Hei. 8-78329.

Figure 11A:
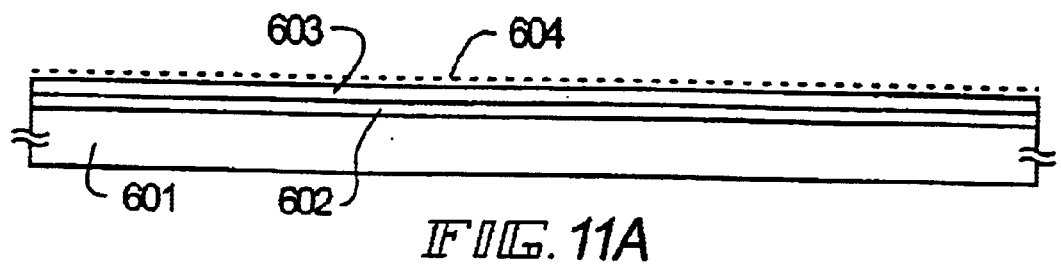
FIGS. 11A and 11B are explanatory views of fabricating steps of the TFT of Embodiment 5 and substrate sectional views.
Figure 11B:
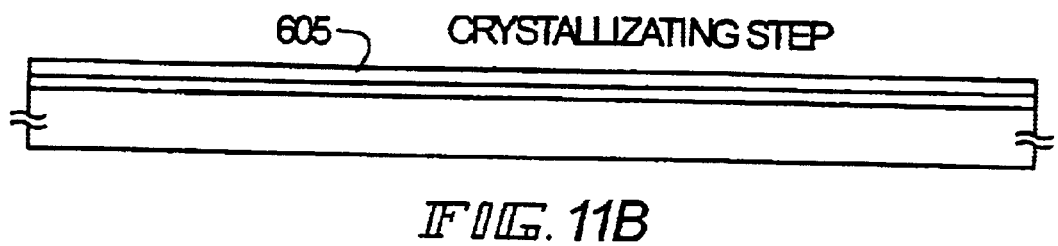

Here, an example of the case where the technique disclosed in Japanese Patent Application Laid-open No. Hei. 7-130652 is applied to the present invention will be described with reference to FIGS. 11A and 11B. First, an under film 602 was formed on a substrate 601, and a noncrystalline silicon film (also called amorphous silicon) 603 was formed thereon. In this embodiment, a silicon oxide was used for an upper layer of the under film 602, and a silicon nitride oxide ($SiN_xB_yO_z$) containing boron was used for a lower layer, so that deterioration of characteristics due to heat of the semiconductor device was prevented. If film peeling does not occur, an amorphous silicon film may be formed to be in contact with the silicon nitride oxide ($SiN_xB_yO_z$). Further, a nickel acetate salt solution containing nickel of 10 ppm in terms of weight was applied to form a nickel containing layer 604 (FIG. 11A).

Next, after a dehydrogenating step at 500° C. for 1 hour was carried out, a heat treatment at 500 to 650 ° C. for 4 to 24 hours (in this embodiment, at 550° C. for 14 hours) was carried out, so that a crystalline silicon film 605 was formed. The crystalline silicon film (also called polysilicon) 605 obtained in this way had extremely superior crystallinity (FIG. 11B).

The technique disclosed in Japanese Patent Application Laid-open No. Hei. 8-78329 is such that selective crystallization of an amorphous semiconductor film is made possible by selectively adding a catalytic element. A case where the technique is applied to the present invention will be described with reference to FIGS. 12A and 12B.

First, an under film 702 was formed on a glass substrate 701, and an amorphous silicon film 703 and a silicon oxide film 704 were continuously formed thereon. A silicon oxide was used for an upper layer of the under film 702, and a silicon nitride oxide ($SiN_xB_yO_z$) containing boron was used for a lower layer, so that deterioration of characteristics due to heat of the semiconductor device was prevented. If film peeling does not occur, an amorphous silicon film may be formed to be in contact with the silicon nitride oxide film ($SiN_xB_yO_z$).

Figure 12A:
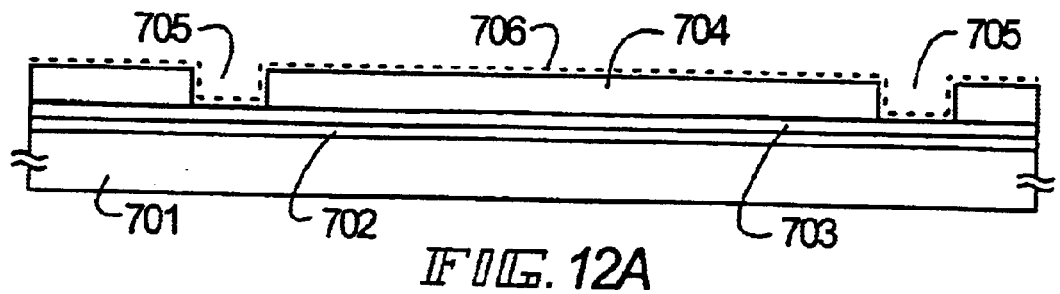
FIGS. 12A and 12B are explanatory views of fabricating steps of a of TFT Embodiment 5 and substrate sectional views.
Figure 12B:
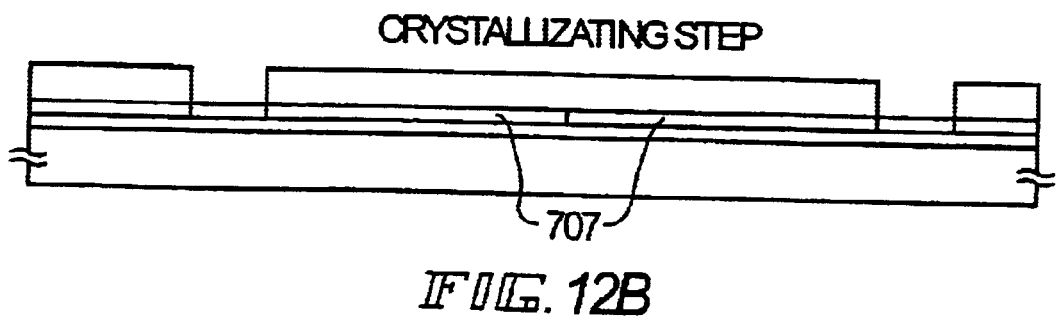

Next, the silicon oxide film 704 was patterned to selectively form opening portions 705. Thereafter, a nickel acetate salt solution containing nickel of 10 ppm in terms of weight was applied. By this, a nickel containing layer 706 was formed, and the nickel containing layer 706 was brought into contact with the amorphous silicon film 702 at only the bottoms of the opening portions 705 (FIG. 12A).

Next, a heat treatment at 500 to 650° C. for 4 to 24 hours (in this embodiment, at 580° C. for 14 hours) was carried out, so that a crystalline silicon film 707 was formed. In this crystallizing process, a portion with which nickel is in contact is first crystallized, and crystal growth proceeds in the lateral direction therefrom. The thus formed crystalline silicon film 707 is made of a collective of rod-like or needle-like crystals, and the respective crystals macroscopically grow with certain directionality. Thus, there is an advantage that crystallinity is uniform.

In the foregoing two techniques, as a usable catalytic element, in addition to nickel (Ni), an element such as germanium (Ge), iron (Fe), palladium (Pd), tin (Sn), lead (Pb), cobalt (Co), platinum (Pt), copper (Cu), or gold (Au) may be used.

If a crystalline semiconductor film (including a crystalline silicon film, a crystalline silicon germanium film, etc.) is formed by using the technique as described above and patterning is carried out, a semiconductor layer of a TFT can be formed. Although superior characteristics can be obtained in the TFT fabricated from the crystalline semiconductor by using the technique of this embodiment, high reliability has been required because of that. However, when the insulating film of the present invention and the TFT structure is adopted, it becomes possible to fabricate the TFT which utilizes the technique of this embodiment to the utmost.

Embodiment 6

In this embodiment, a description will be made on an example in which as a method of forming the semiconductor layers 504 and 505 used in Embodiment 4, after a crystalline semiconductor film is formed by using an amorphous semiconductor film as an initial film and by using a catalytic element as in Embodiment 5, a step of removing the catalytic element from the crystalline semiconductor film is carried out. As a method thereof, this embodiment uses a technique disclosed in Japanese Patent Application Laid-open No. Hei. 10-135468 or No. Hei. 10-135469.

The technique disclosed in the application is such that a catalytic element used for crystallization of an amorphous semiconductor film is removed after crystallization by using a gettering function of phosphorus. By using the technique, it is possible to reduce the concentration of a catalytic element in a crystalline semiconductor film to $1\times10^{17}$ atoms/cm$^3$ or less, preferably $1\times10^{16}$ atoms/cm$^3$ or less.

Figure 13A:
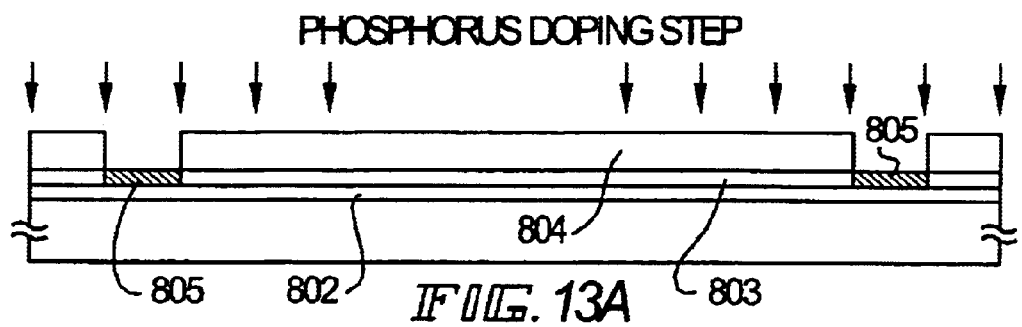
FIGS. 13A and 13B are explanatory views of gettering steps of Embodiment 6 and substrate sectional views.
Figure 13B:
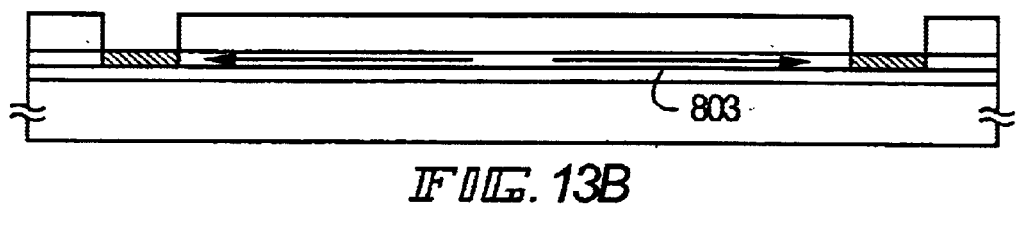

A structure of this embodiment will be described with reference to FIGS. 13A and 13B. Here, an alkali-free glass substrate typified by a 1737 substrate made by Corning Inc. was used. FIG. 13A shows a state in which an under film 802 and a crystalline silicon film 803 were formed by using the crystallizing technique disclosed in Embodiment 2. In this embodiment, a silicon nitride oxide was used for an upper layer of the under film 802, and a silicon nitride oxide (SiN$_x$B$_y$O$_z$) containing boron was used as a lower layer, so that deterioration of characteristics due to heat of the semiconductor device was prevented. If film peeling does not occur, an amorphous silicon film may be formed to be in contact with the silicon nitride oxide (SiN$_x$B$_y$O$_z$). Then, a silicon oxide film 804 for masking was formed to a thickness of 150 nm on the surface of the crystalline silicon film 803, and opening portions were provided by patterning, so that regions where the crystalline silicon film was exposed were provided. Then, a step of adding phosphorus was carried out so that a region 805 added with phosphorus was provided in the crystalline silicon film.

In this state, when a heat treatment at 550 to 800° C. for 5 to 24 hours (in this embodiment, at 600° C. for 12 hours) was carried out in a nitrogen atmosphere, the region 805 where phosphorus was added in the crystalline silicon film functioned as a gettering site, so that it was possible to move the catalytic element remaining in the crystalline silicon film 803 into the region 805 added with phosphorus.

By removing the silicon oxide film 804 for masking and the region 805 added with phosphorus through etching, it was possible to obtain a crystalline silicon film in which the concentration of the catalytic element used in the step of crystallization was reduced to $1\times10^{17}$ atoms/cm$^3$ or less. It was possible to use this crystalline silicon film without any change as the semiconductor layer of the TFT of the present invention described in Embodiment 4.

Embodiment 7

In this embodiment, a description will be made on another example of forming the semiconductor layers 504 and 505 and the gate insulating film 506 in the step of fabricating the TFT of the present invention described in Embodiment 4.

Figure 14A:
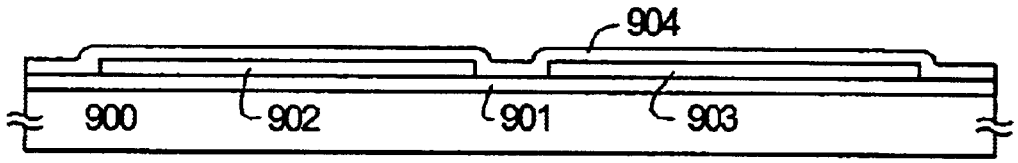
FIGS. 14A and 14B are explanatory views of gettering steps of Embodiment 7 and substrate sectional views.

Here, a substrate having heat resistance of at least about 700 to 1100° C. was necessary and a quartz substrate 900 was used. A silicon oxide was used for an upper layer of an under film 901, and a silicon nitride oxide (SiN$_x$B$_y$O$_z$) containing boron was used for a lower layer, so that deterioration of characteristics due to heat of the semiconductor device was prevented. If film peeling does not occur, an amorphous silicon film may be formed to be in contact with the silicon nitride oxide (SiN$_x$B$_y$O$_z$). Then, the technique disclosed in Embodiment 5 was used to form a crystalline semiconductor film. For the purpose of transforming this into an active layer of a TFT, this was patterned into island-like regions so that semiconductor layers 902 and 903 were formed. A gate insulating film 904 covering the semiconductor layers 902 and 903 was formed of a film containing silicon oxide as its main ingredient. In this embodiment, a silicon nitride oxide film having a thickness of 70 nm was formed by a plasma CVD method (FIG. 14A).

Figure 14B:
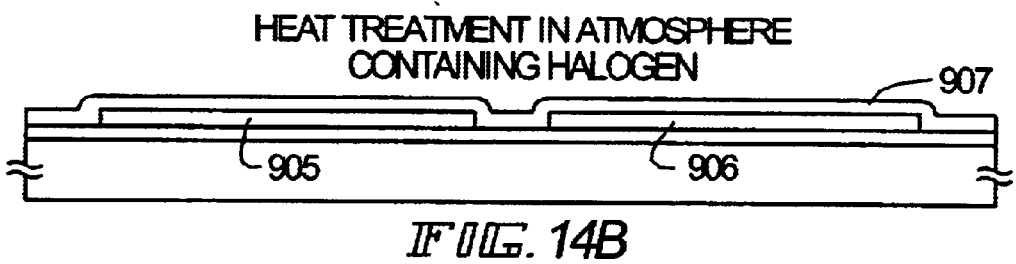

Then, a heat treatment was carried out in an atmosphere containing a halogen (typically, chlorine) and oxygen. In this embodiment, the heat treatment was carried out at 950° C. for 30 minutes. Incidentally, it was appropriate that the treatment temperature was selected within the range of 700 to 1100° C. and the treatment time was selected within the range of 10 minutes to 8 hours (FIG. 14B).

As a result, under the condition of this embodiment, a thermal oxidation film was formed at the interface between the semiconductor layer 902 or 903 and the gate insulating film 904, so that a gate insulating film 907 was formed.

The gate insulating film 907 fabricated through the above steps had a high withstand voltage, and the interface between the semiconductor layer 905 or 906 and the gate insulating film 907 was very excellent. If the subsequent steps comply with Embodiment 4, the TFT can be fabricated.

Of course, an operator may suitably determine to combine this embodiment with Embodiment 5 or 6.

Embodiment 8

In this embodiment, a description will be made on an example in which a crystalline silicon film is fabricated by steps different from those in Embodiment 4. Specifically, a description will be made on a gettering step different from a gettering step with phosphorus described in Embodiment 5. Since basic steps comply with FIGS. 9A to 9E or FIGS. 10A to 10C, attention is paid to only different points and a description will be made.

Figure 15A:
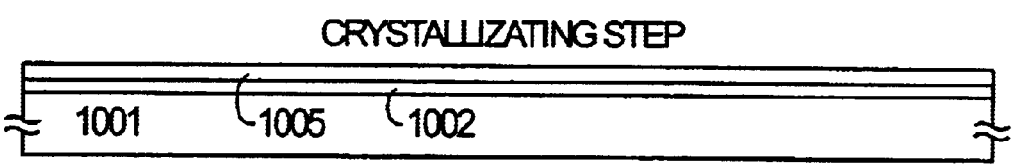
FIGS. 15A and 15B are explanatory views of gettering steps of Embodiment 8 and substrate sectional views.

First, in accordance with steps of Embodiment 5, the state of FIG. 15A was obtained. The thermal crystallizing technique shown in Embodiment 5 is used for formation of a crystalline silicon film 1005 which becomes an active layer of a TFT.

Next, the whole substrate 1001 is immersed in a liquid phase (in this embodiment, a sulfuric acid solution) heated to a temperature of 300° C., so that nickel used for crystallization is removed or reduced. In this embodiment, although gettering is carried out before patterning of an active layer is carried out, the gettering may be carried out after the patterning of the active layer is carried out. As another means for establishing contact with sulfuric acid, a method of uniformly dropping a heated sulfuric acid solution onto the substrate may be used.

Figure 15B:
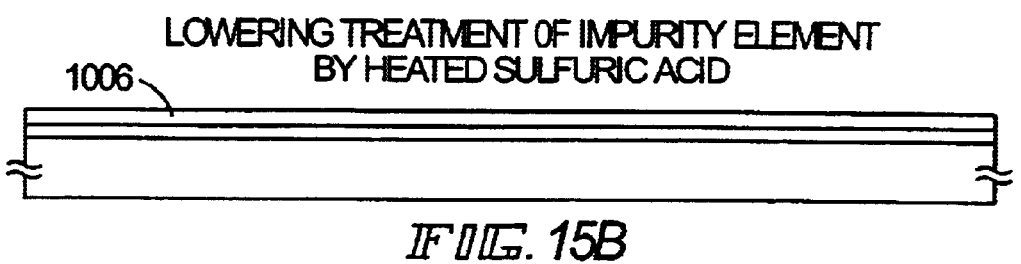

In this step, nickel resolves and dissolves in the heated sulfuric acid, and is easily removed from the vicinity of the surface. Then, nickel in the inside diffuses to the vicinity of the surface having a low concentration, and more nickel is dissolved. This phenomenon is repeated, so that nickel used for crystallization is removed or reduced from the crystalline silicon film. In this way, by carrying out the lowering treatment of the catalytic element through the liquid phase, the concentration of the catalytic element in the crystalline silicon film 1106 can be lowered to $1\times10^{17}$ atoms/cm$^3$, preferably $1\times10^{16}$ atoms/cm$^3$ (FIG. 15B).

For the purpose of increasing the contact property between the sulfuric acid solution and the crystalline semiconductor film, it is preferable to previously remove a natural oxide film or the like on the surface of the crystalline semiconductor film by an etchant containing fluoric acid so that cleaning is made. By doing so, the gettering efficiency can be increased.

In this embodiment, although the description has been made while using nickel as an example, even the other catalytic elements described above are also gettered by the same phenomenon.

When the crystalline silicon film 1006 obtained through the above steps and the process described in Embodiment 5 is used, the TFT shown in FIGS. 10A to 10C is obtained.

Incidentally, the structure of this embodiment can be freely combined with any structure of Embodiments 4 to 7.

Embodiment 9

Figure 16A:
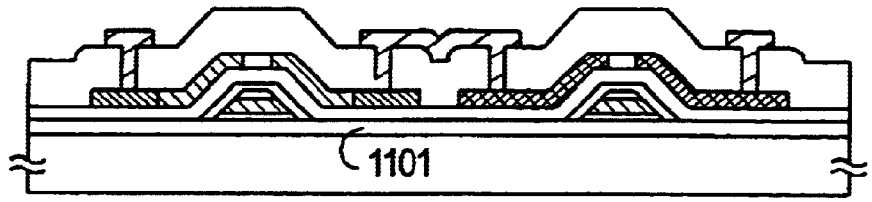
FIGS. 16A and 16B are explanatory views of Embodiment 9 and substrate sectional views.

In Embodiment 1, the description has been made on the example in which the insulating film ($SiN_xB_yO_z$) containing boron of 0.1 to 50 atoms % and having high thermal conductivity is used as one layer of the gate insulating film of the bottom gate type TFT. In this embodiment, an example in which the silicon nitride oxide ($SiN_xB_yO_z$) containing boron according to the present invention is applied to an insulating film used for a forward stagger TFT will be described with reference to FIGS. 16A and 16B.

Figure 16B:
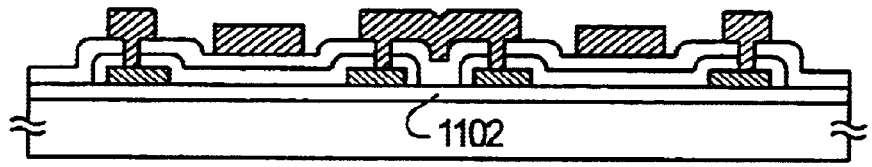

FIG. 16B shows a typical forward stagger TFT. First, a source layer and a drain layer are formed on a substrate provided with an under film 1100. Next, an amorphous silicon film covering the source layer and the drain layer is formed, and is crystallized by laser light, so that a semiconductor layer 1101 is formed. Thereafter, an Insulating film is formed, and a gate electrode and a wiring electrode are formed, so that the forward stagger TFT is formed. In this embodiment, the silicon nitride oxide ($SiN_xB_yO_z$) containing boron is applied to the under film 1100 or the insulating film 1102.

Like this, the present invention can be applied irrespectively of the TFT structure.

Embodiment 10

In this embodiment, an example of a liquid crystal display device fabricated by the present invention will be described with reference to FIG. 17. Since well-known means may be used for a method of fabricating a pixel TFT (pixel switching element) or for a cell assembling step, their detailed description is omitted.

Figure 17:
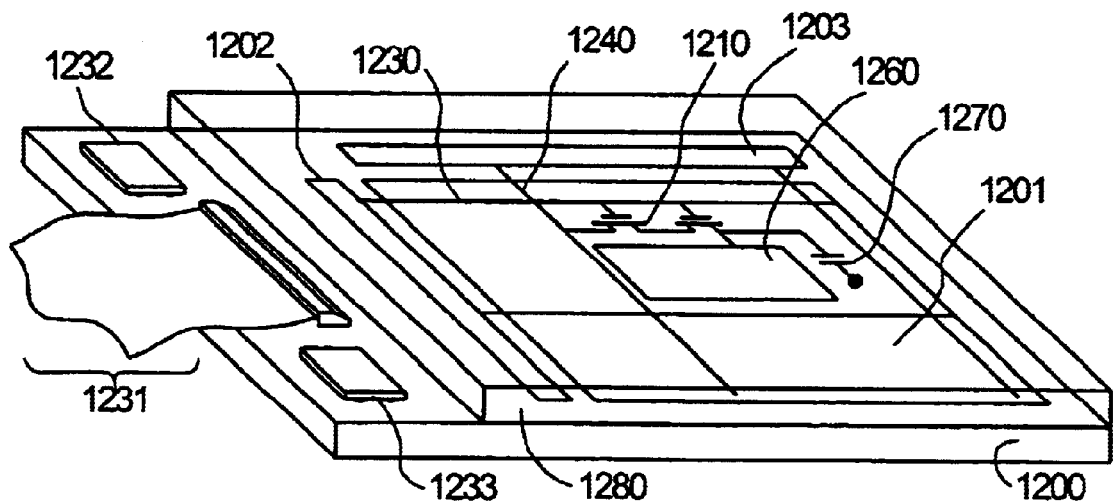
FIG. 17 is a view showing a structure of an active matrix substrate.

FIG. 17 is a schematic view of an active matrix type liquid crystal panel of this embodiment. As shown in FIG. 17, an active matrix substrate and an opposite substrate are opposite to each other, and a liquid crystal is held between these substrates. The active matrix substrate includes a pixel matrix circuit 1201, a scanning line driver circuit 1202, and a signal line driver circuit 1203 on a glass substrate 1200.

The scanning line driver circuit 1202 and the signal line driver circuit 1203 are respectively connected to the pixel matrix circuit 1201 through a scanning line 1230 and a signal line 1240. These driver circuits 1202 and 1203 are mainly constituted by CMOS circuits.

The scanning line 1230 is formed for every row of the pixel matrix circuit 1201, and the signal line 1240 is formed for every column. A pixel TFT 1210 is formed in the vicinity of the crossing portion between the scanning line 1230 and the signal line 1240. A gate electrode of the pixel TFT 1210 is connected to the scanning line 1230, and a source is connected to the signal line 1240. Further, a pixel electrode 1260 and a holding capacitance 1270 are connected to a drain.

With respect to an opposite substrate 1280, a transparent conductive film such as an ITO film is formed on the whole surface of a glass substrate. The transparent conductive film is an opposite electrode to the pixel electrode 1260 of the pixel matrix circuit 1201, and the liquid crystal material is driven by electric field formed between the pixel electrode and the opposite electrode. If necessary, an oriented film, a black matrix, or a color filter is formed on the opposite substrate 1280.

On the glass substrate at the side of the active matrix substrate, IC chips 1232 and 1233 are attached using a surface to which an FPC 1231 is attached. These IC chips 1232 and 1233 are constructed by forming circuits, such as a processing circuit of a video signal, a timing pulse generating circuit, a γ-correction circuit, a memory circuit, or an arithmetic circuit, on the silicon substrate.

In this embodiment, although the description has been made on the liquid crystal display device as an example, it is needless to say that the present invention can be applied to an EL (electroluminescence) display device or an EC (electrochromic) display device as long as the device is an active matrix type display device.

It does not matter whether the liquid crystal display device which can be fabricated by using the present invention is a transmission type or a reflection type. The operator can freely select any type. Like this, the present invention can be applied to any active matrix type electro-optical devices (semiconductor devices).

Incidentally, in fabrication of the semiconductor device described in this embodiment, any structure of Embodiments 1 to 9 may be adopted, and the respective embodiments can be freely combined and used.

Embodiment 11

The present invention can be applied to the whole conventional IC technique. That is, the present invention can be applied to all the semiconductor circuits put on the market at present. For example, the invention may be applied to a microprocessor such as a RISC processor or an ASIC processor integrated on one chip, or may be applied to a signal processing circuit typified by a driver circuit for liquid crystal (D/A converter, γ-correction circuit, signal dividing circuit, etc.), or a high frequency circuit for a portable equipment (portable telephone, PHS, mobile computer).

Moreover, it is also possible to realize such a semiconductor device of three-dimensional structure that an interlayer insulating film is formed on a conventional MOSFET and a semiconductor circuit is formed thereon by using the present invention. Like this, the present invention can be applied to any semiconductor devices in which LSIs are used at present. That is, the present invention may be applied to an SOI structure (TFT structure using a single crystal semiconductor thin film) such as SIMOX, Smart-Cut (registered trademark by SOITEC Inc.), or ELTRAN (registered trademark by Canon Inc.).

A semiconductor circuit such as a microprocessor is incorporated in various electronic equipments and functions as a central circuit. As typical electronic equipments, a personal computer, a portable information terminal equipment, and any other electric home appliances can be enumerated. Besides, a computer for controlling a vehicle (automobile, electric train, etc.) and the like can also be enumerated. The present invention can also be applied to such semiconductor devices.

Incidentally, in fabrication of the semiconductor device described in this embodiment, any structure of Embodiments 1 to 9 may be adopted, and the respective embodiments can be freely combined and used.

Embodiment 12

In Embodiment 1, the description has been made on the example in which a crystalline silicon film is used as an active layer of a TFT. In this embodiment, an example in which an amorphous silicon film is used as an active layer will be described.

An insulating film containing boron according to the present invention is suitable to an amorphous TFT using an amorphous silicon film as an active layer rather than a polysilicon TFT using a crystalline silicon film as an active layer.

A gate electrode is formed on a substrate in accordance with Embodiment 1.

Next, a gate insulating film and an amorphous silicon film are continuously formed to cover the gate electrode. In the case of an amorphous silicon TFT, although the gate insulating film may be made a multi-layer film similarly to Embodiment 1, since boron is not activated and does not influence the conductivity even if boron is mixed in an active layer made of amorphous silicon, in this embodiment, a silicon nitride oxide film added with boron and an amorphous silicon film were continuously formed in the same chamber. Since oxygen is contained, the internal stress of the silicon nitride oxide film added with boron is typically $-5 \times 10^{10}$ dyn/cm$^2$ to $5 \times 10^{10}$ dyn/cm$^2$, preferably $-10^{10}$ dyn/cm$^2$ to $10^{10}$ dyn/cm$^2$, which is a preferable stress range in adhesion to the amorphous silicon film.

Next, similarly to Embodiment 1, an insulating film (subsequently serving as a channel protective film) for protecting a channel formation region was formed on the amorphous semiconductor film. This insulating film may also be formed continuously to the amorphous silicon film.

Subsequent steps were carried out in accordance with Embodiment 1 and a bottom gate type TFT was completed.

In this embodiment, the example in which the silicon nitride oxide film containing boron is used as one layer of the gate insulating film of the bottom gate type TFT has been described. However, the film in which the silicon nitride oxide film is used is not particularly limited as long as the film is an insulating film. For example, the silicon nitride oxide film can be used as an under film, an interlayer insulating film, a mask insulating film, a channel protecting film, a protecting film, or the like.

For example, when such a structure is employed that a silicon nitride oxide film containing boron is used as a gate insulating film, a silicon nitride oxide film containing boron is used as a channel protecting film, and a channel formation region is sandwiched between the silicon nitride films containing boron, a heat dissipation effect is further effectively obtained. Alternatively, such a structure may be adopted that a silicon nitride film containing boron is used as a gate insulating film, and a silicon nitride oxide film containing boron is used as a channel protecting film. Further, such a structure may be adopted that a silicon nitride film is used as a gate insulating film, and a silicon nitride oxide film containing boron is used as a channel protecting film.

Figure 22:
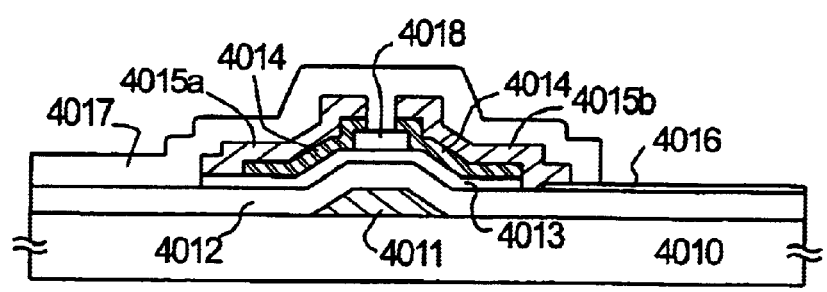
FIG. 22 is a view showing a structure of a bottom gate type TFT using an amorphous silicon.

In general, a bottom gate type TFT using an amorphous silicon has a structure as shown in FIG. 22. It is needless to say that also in such a structure, a silicon nitride oxide film containing boron according to the present invention can be applied.

In FIG. 22, reference numeral 4010 designates a substrate; 4011, a gate electrode; 4012. a gate insulating film; 4013, a semiconductor region made of amorphous silicon: 4014, a semiconductor region doped with an impurity element (phosphorus, boron, etc.) to give a p type or an n type, 4015a, a source electrode; 4015b, a drain electrode; 4016, a pixel electrode; 4017, an interlayer insulating film; and 4018, a channel protecting film. The present invention can be used for the insulating film shown in FIG. 22, for example, the gate insulating film 4012, the interlayer insulating film 4017, and the channel protecting film 4018.

Moreover, in the case where the silicon nitride oxide film containing boron is used as the gate insulating film 4012 and the channel protecting film 4018, since the semiconductor region 4013 is sandwiched between the silicon nitride oxide films containing boron, heat dissipation can be effectively made. Instead of the silicon nitride oxide film containing boron, a silicon nitride film containing born can be used.

Incidentally, in fabrication of the semiconductor device described in this embodiment, any structure of Embodiments 1 to 3 may be adopted, and the device can be freely combined with the respective Embodiments 10 and 11 and can be used.

Embodiment 13

In this embodiment, a description will be made on an example in which an EL (electroluminescence) display panel (also called an EL display device) is fabricated using the present invention.

Figure 21A:
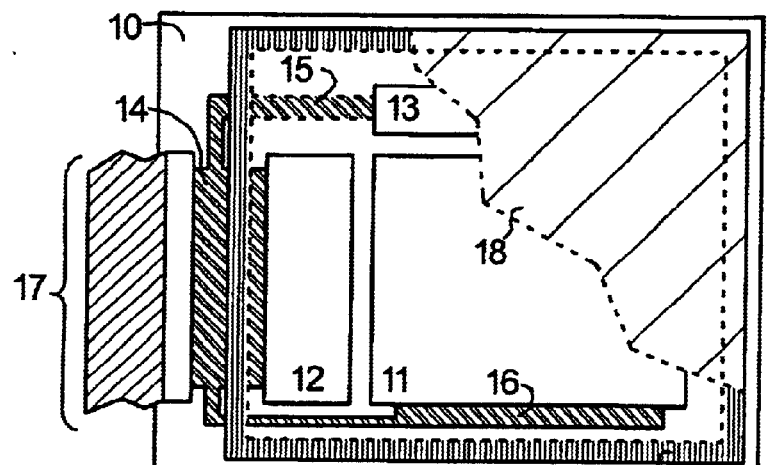
FIGS. 21A and 21B are explanatory views of an EL display device.

FIG. 21A is a top view of an EL display panel using the present invention. In FIG. 21A, reference numeral 10 designates a substrate; 11, a pixel portion; 12, a source side driver circuit; and 13, a gate side driver circuit. The respective driver circuits lead to an FPC 17 through wiring lines 14 to 16 and are connected to an external equipment.

At this time, a substrate 82 is provided so as to surround at least the pixel portion, preferably the driver circuits and the pixel portion. As the substrate 82, a glass plate or a plastic plate may be used, or an ultraviolet ray curing resin may be used. In the case where the substrate 82 is used, the substrate 82 is bonded to the substrate 10 by an adhesive 81, and a resin 20 is filled in a space formed between the substrates. At this time, an EL component is put in such a state that it is completely sealed in the resin, and it is completely insulated from the outer air.

Besides, an inert gas (argon, helium, nitrogen, etc.) may be filled in a hermetic space provided between the substrate 82 and the substrate 10, or a drying agent such as barium oxide may be provided in the space. By this, it is possible to suppress deterioration of the EL component due to moisture or the like.

Figure 21B:
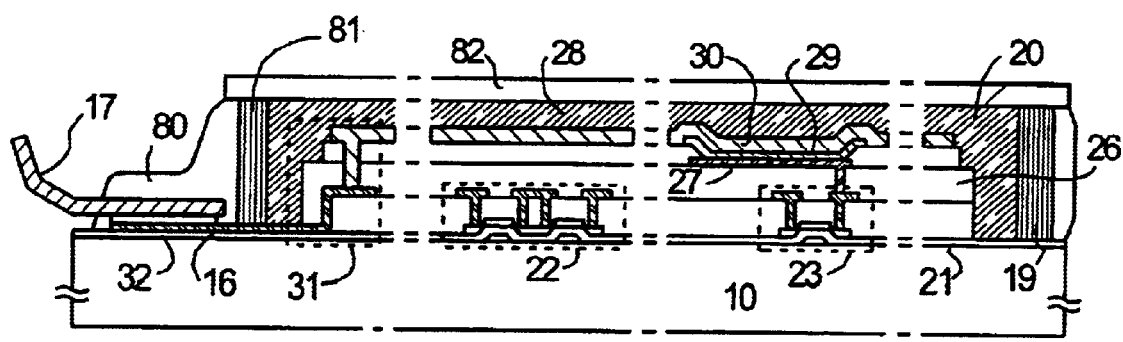

FIG. 21B is a view showing a sectional structure of the EL display panel of this embodiment. A driver circuit TFT 22 (here, a CMOS circuit made of a combination of an NTFT and a PTFT is shown) and a pixel portion TFT 23 (here, only a TFT for controlling a current to the EL component is shown) are formed on an inorganic insulating film 21 of the substrate 10. As the driver circuit TFT 22, the NTFT and the PTFT shown in FIGS. 7A to 7C may be used. As the pixel portion TFT 23, the NTFT or PTFT shown in FIGS. 8A and 8B may be used.

After the driver circuit TFT 22 and the pixel portion TFT 23 are completed by using the present invention, a pixel electrode 27 electrically connected to a drain of the pixel portion TFT 23 and made of a transparent conductive film is formed on an interlayer insulating film (flattening film) 26 made of a resin material. As the transparent conductive film, a compound (called ITO) of indium oxide and tin oxide or a compound of indium oxide and zinc oxide may be used. After the pixel electrode 27 is formed, an insulating film 28 is formed, and an opening portion is formed over the pixel electrode 27.

Next, an EL layer 29 is formed. The EL layer 29 may be made of a laminate structure by freely combining well-known EL materials (a hole injection layer, a hole transport layer, a light emitting layer. an electron transport layer, or an electron injection layer) or a single-layer structure. A well-known technique may be used to determine what structure is formed. The EL material includes a low molecular material and a high molecular (polymer) material. In the case where the low molecular material is used, an evaporation method is used. In the case where the high molecular material is used, it is possible to use a simple method such as a spin coating method, a printing method, or an ink jet method, etc.

In this embodiment, the EL layer is formed by using a shadow mask and by the evaporation method. A light-emitting layer (a red light-emitting layer, a green light-emitting layer, and a blue light-emitting layer) capable of emitting light with different wavelengths is formed for every pixel by using the shadow mask, so that color display becomes possible. In addition to that, there is a system in which a color conversion layer (CCM) and a color filter are combined or a system in which a white light-emitting layer and a color filter are combined, and any of the methods may be used. Of course, an EL display device of monochromatic light emission may be made.

After the EL layer 29 is formed, a cathode 30 is formed thereon. It is desirable that moisture and oxygen existing at the interface between the cathode 30 and the EL layer 29 is removed to the utmost degree. Thus, such contrivance is necessary that the EL layer 29 and the cathode 30 are continuously formed in vacuum, or the EL layer 29 is formed in an inert gas atmosphere and the cathode 30 is formed without opening to the air. In this embodiment, a multi-chamber system (cluster tool system) film forming apparatus is used so that the foregoing film formation is made possible.

In this embodiment, a laminate structure of a LiF (lithium fluoride) film and an Al (aluminum) film is used for the cathode 30. Specifically, a LiF (lithium fluoride) film having a thickness of 1 nm is formed on the EL layer 29 by an evaporation method, and an aluminum film having a thickness of 300 nm is formed thereon. Of course, a MgAg electrode of a well-known cathode material may be used. The cathode 30 is connected to the wiring line 16 in a region designated by 31. The wiring line 16 is a power source supply line for supplying a predetermined voltage to the cathode 30, and is connected to the FPC 17 through a conductive paste material 32. A resin 80 covers a connecting portion and protects the connecting portion.

For the purpose of electrically connecting the cathode 30 to the wiring line 16 in the region 31, it is necessary to form a contact hole in the interlayer insulating film 26 and the insulating film 28. This may be formed at the time of etching of the interlayer insulating film 26 (at the time of formation of the contact hole for the pixel electrode) and at the time of etching of the insulating film 28 (at the time of formation of the opening portion prior to the formation of the EL layer). Besides, when the insulating film 28 is etched, the interlayer insulating film 26 may also be etched at the same time. In this case, if the interlayer insulating film 26 and the insulating film 28 are made of the same resin material, it is possible to make the shape of the contact hole excellent.

The wiring line 16 is electrically connected to the FPC 17 through the gap (it is filled with the adhesive 81) between the substrate 82 and the substrate 10. Although the description has been made on the wiring line 16, the other wiring lines 14 and 15 are also electrically connected to the FPC 17 through the portion under the substrate 82 in the same manner.

In the EL display panel having the structure as described above, the present invention can be used for the driver circuit TFT 22 and the pixel portion TFT 23. Incidentally, in this embodiment, although the bottom gate structure is employed, a top gate structure may be employed. Besides, the TFT structure may be a single gate structure, a double gate structure, a triple gate structure, or a multi-gate structure having more gates. Besides, the PTFT of the present invention may be used for the formation.

Embodiment 14

A CMOS circuit and a pixel matrix circuit formed through carrying out the present invention may be applied to various electro-optical devices (active matrix type liquid crystal displays, active matrix type EL displays, active matrix type EC displays). Namely, the present invention may be embodied in all the electronic equipments that incorporate those electro-optical devices into display units.

As such an electronic equipment, a video camera, a digital camera, a projector (rear-type or front-type projector), a head mount display (goggle-type display), a navigation system for vehicles, a stereo for vehicles, a personal computer, and a portable information terminal (a mobile computer, a cellular phone, or an electronic book, etc.) may be enumerated. Examples of those are shown in FIGS. 18A to 18F, 19A to 19D and 20A to 20C.

Figure 18A:
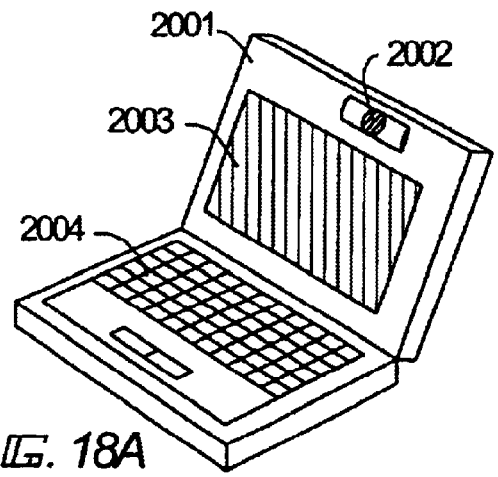
FIGS. 18A to 18F are explanatory views of electronic equipments.

FIG. 18A shows a personal computer comprising a main body 2001, an image inputting unit 2002, a display unit 2003, and a key board 2004 and the like. The present invention is applicable to the image inputting unit 2002, the display unit 2003, and other signal control circuits.

Figure 18B:
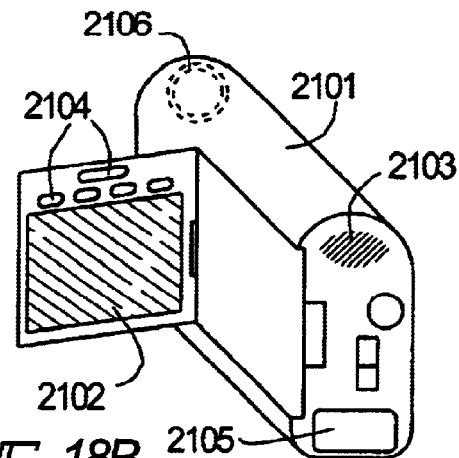

FIG. 18B shows a video camera comprising a main body 2101, a display unit 2102, a voice input unit 2103, operation switches 2104, a battery 2105, and an image receiving unit 2106 and the like. The present invention is applicable to the display unit 2102 and other signal control circuits.

Figure 18C:
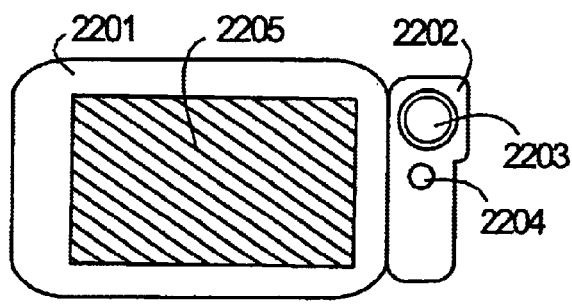

FIG. 18C shows a mobile computer comprising a main body 2201, a camera unit 2202, an image receiving unit 2203, an operation switch 2204, and a display unit 2205 and the like. The present invention is applicable to the display unit 2205 and other signal control circuits.

Figure 18D:
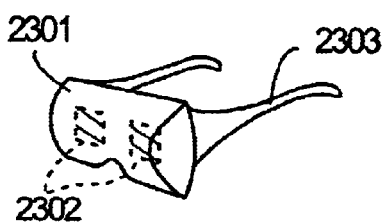

FIG. 18D shows a goggle-type display comprising a main body 2301, a display unit 2302 and arm portions 2303 and the like. The present invention is applicable to the display unit 2302 and other signal control circuits.

Figure 18E:
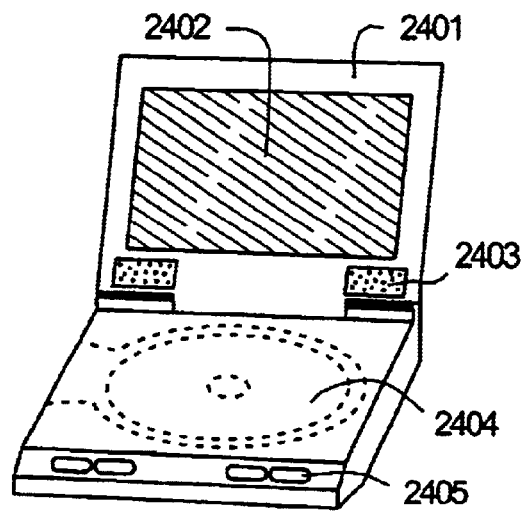

FIG. 18E shows a player that employs a recoding medium in which programs are recorded (hereinafter referred to as recording medium), and comprises a main body 2401, a display unit 2402, a speaker unit 2403, a recording medium 2404, and an operation switch 2405 and the like. Incidentally, this player uses as the recoding medium a DVD (digital versatile disc), a CD and the like to serve as a tool for enjoying music or movies, for playing video games and for connecting to the Internet. The present invention is applicable to the display unit 2402 and other signal control circuits .

Figure 18F:
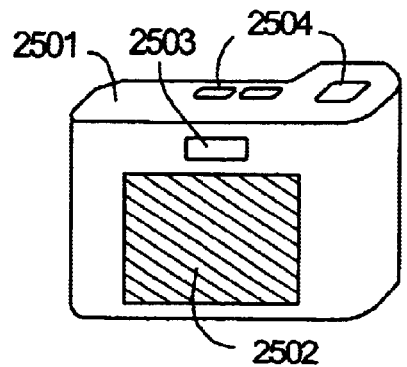

FIG. 18F shows a digital camera comprising a main body 2501, a display unit 2502, an eye piece section 2503, operation switches 2504, and an image receiving unit (not shown) and the like. The present invention is applicable to the display unit 2502 and other signal control circuits.

Figure 19A:
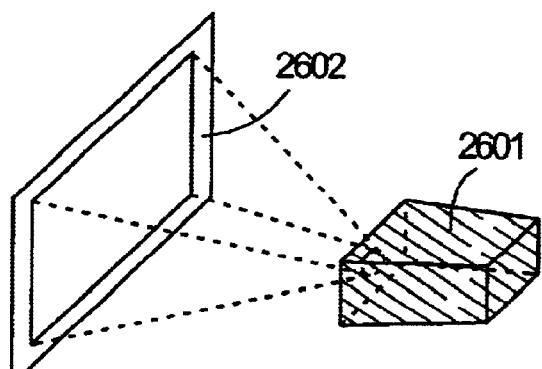
FIGS. 19A to 19D are explanatory views of electronic equipments.

FIG. 19A shows a front-type projector comprising a projection device 2601, a screen 2602 and the like. The present invention is applicable to a liquid crystal display device 2808 that constitutes a part of the projection device 2601 and other signal control circuits.

Figure 19B:
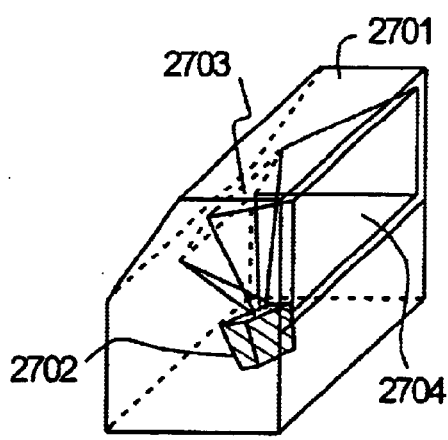

FIG. 19B shows a rear-type projector comprising a main body 2701, a projection device 2702, a mirror 2703, and a screen 2704 and the like. The present invention is applicable to the liquid crystal display device 2808 that constitutes a part of the projection device 2702 and other signal control circuits.

Figure 19C:
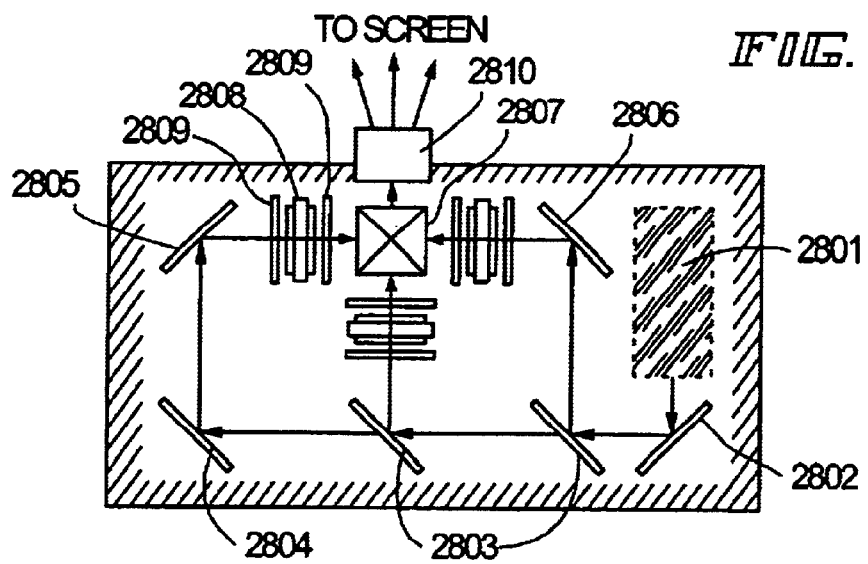

FIG. 19C is a diagram showing an example of the structure of the projection devices 2601 and 2702 in FIGS. 19A and 19B. The projection device 2601 or 2702 comprises a light source optical system 2801, mirrors 2802 and 2804 to 2806, dichroic mirrors 2803, a prism 2807, liquid crystal display devices 2808, phase difference plates 2809, and a projection optical system 2810. The projection optical system 2810 consists of an optical system including a projection lens. This embodiment shows an example of "three plate type", but not particularly limited thereto. For instance, the invention may be applied also to "single plate type". Further, in the light path indicated by an arrow in FIG. 19C, an optical system such as an optical lens, a film having a polarization function, a film for adjusting a phase difference and an IR film may be provided on discretion of a person who carries out the invention.

Figure 19D:
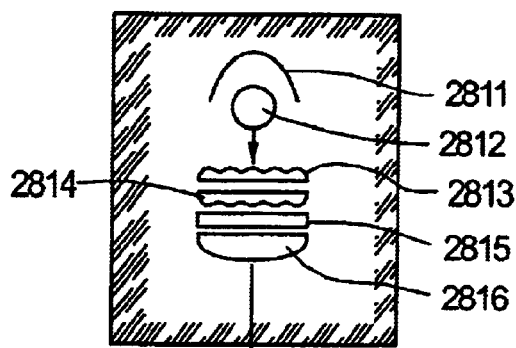

FIG. 19D is a diagram showing an example of the structure of the light source optical system 2801 in FIG. 19C. In this embodiment, the light source optical system 2801 comprises a reflector 2811, light source 2812, lens arrays 2813 and 2814, a polarization conversion element 2815, and a condenser lens 2816. The light source optical system shown in FIG. 19D is an example thereof, and is not particularly limited. For instance, on discretion of a person who carries out the invention, the light source optical system may be provided with an optical system such as an optical lens, a film having a polarization function, a film for adjusting the phase difference and an IR film.

However, the projector shown in FIG. 19 shows the case in which the electro-optical device of transmission type is employed and an application example using the electro-optical device of reflective type and the EL display device is not illustrated.

Figure 20A:
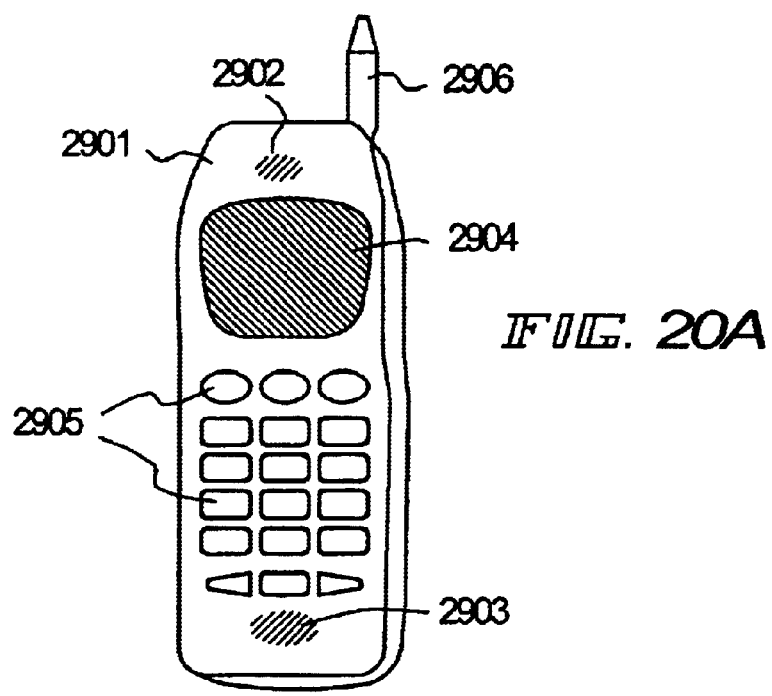
FIGS. 20A to 20C are explanatory views of electronic equipments.

FIG. 20A is a cellular phone that is composed of a main body 2901, a voice output unit 2902, a voice input unit 2903, a display unit 2904, operation switches 2905, and an antenna 2906 and the like. The present invention can be applied to the voice output unit 2902, the voice input unit 2903 and the display unit 2904 and other signal control circuits.

Figure 20B:
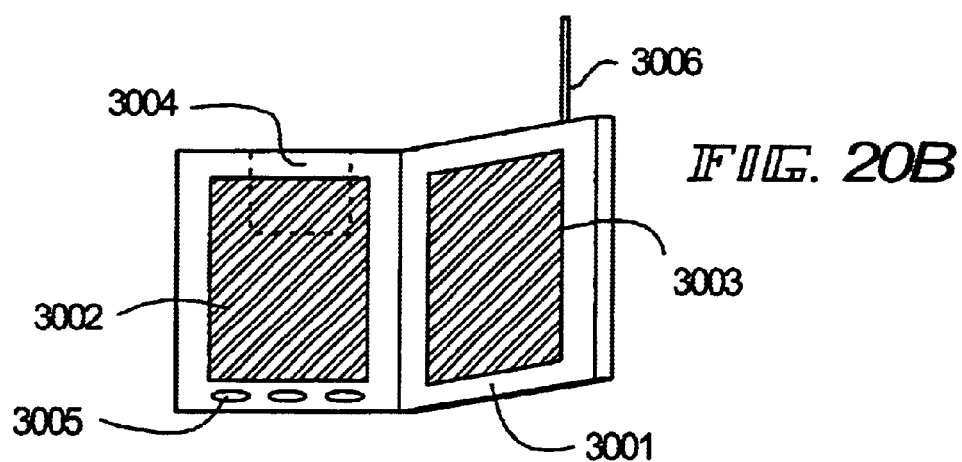

FIG. 20B shows a portable book (electronic book) that is comprised of a main body 3001, display units 3002 and 3003, a memory medium 3004, an operation switch 3005 and an antenna 3006 and the like. The present invention can be applied to the display units 3002 and 3003 and other signal circuits.

Figure 20C:
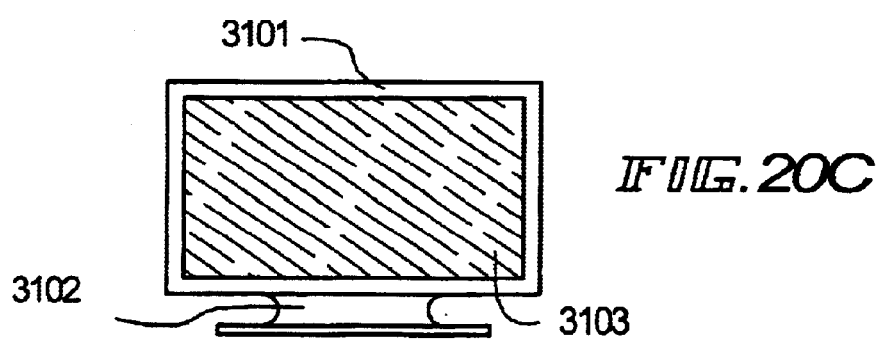

FIG. 20C shows a display that is comprised of a main body 3101, a support base 3102 and a display unit 3103 and the like. The present invention can be applied to the display unit 3103. The display according to the present invention is advantageous in the case where the display is particularly large-sized and in the case where the display is 10 inches or more in an opposite angle (particularly 30 inches or more).

As described above, the present invention has so wide application range that it is applicable to electronic equipments in any field.

When manufacturing the semiconductor device shown in this embodiment, any construction of Embodiments 1 through 9 may be employed and the use of respective embodiments in free combination is possible. In addition, the electro-optical devices and the semiconductor circuits shown in Embodiments 10 and 11 may be used in combination in the above-described manner.

As described above, since the film ($SiN_xB_yO_z$) containing silicon nitride as its main ingredient according to the present invention contains boron of 0.1 to 50 atoms % or 1 to 50 atoms %, preferably 0.1 to 10 atoms %, the film has high thermal conductivity, and has an effect to prevent deterioration of characteristics due to heat of a semiconductor device. Moreover, since the film containing silicon nitride as its main ingredient according to the present invention has a blocking effect to movable ions such as sodium, it has also an effect to prevent these ions from intruding into the semiconductor device, especially a channel formation region from a substrate or the like. In addition, since the film ($SiN_xB_yO_z$) containing silicon nitride as its main ingredient according to the present invention contains oxygen of 1 to 30 atoms %, the internal stress becomes typically $-5 \times 10^{10}$ $dyn/cm^2$ to $5 \times 10^{10}$ $dyn/cm^2$, preferably $-10^{10}$ $dyn/cm^2$ to $10^{10} dyn/cm^2$, and the film has high adhesion (adhesion between a crystalline semiconductor film and the $SiN_xB_yO_z$ film, or adhesion between an amorphous semiconductor film and the $SiN_xB_yO_z$ film) as compared with a conventional silicon nitride film (SiN).

Thus, film peeling is hard to cause.

By using the present invention, it is possible to increase the reliability of a semiconductor device including a CMOS circuit formed of TFTs, specifically, a pixel matrix circuit of a liquid crystal display device, and a driver circuit provided at the periphery thereof. Moreover, the reliability of a semiconductor circuit including TFTs and an electronic equipment incorporating the liquid crystal display device as a part is also improved.

What is claimed is:

1. A semiconductor device comprising:
   a gate electrode formed on an insulating surface;
   a gate insulating film comprising at least a single layer on said gate electrode; and
   a source region, a drain region, and a channel formation region formed between said source region and said drain region, the respective regions being in contact with said gate insulating film;
   wherein said gate insulating film includes a layer of a silicon nitride oxide film containing boron.

2. A semiconductor device according to claim 1, wherein a composition ratio of boron in said silicon nitride oxide film is 0.1 to 50 atoms %.

3. A semiconductor device according to claim 1, wherein a composition ratio of oxygen in said silicon nitride oxide film is 1 to 30 atoms %.

4. A semiconductor device according to claim 1, wherein said semiconductor device is incorporated into a device selected from the group consisting of an electro-optical device and an electronic equipment.

5. A semiconductor device according to claim 4, wherein said electro-optical device is one selected from the group consisting of a liquid crystal display device, an EL display device, an EC display device, and an image sensor.

6. A semiconductor device according to claim 4, wherein said electronic equipment is one selected from the group consisting of a video camera, a digital camera, a projector, a goggle display, a car navigation system, a personal computer, and a portable information terminal.

7. A semiconductor device comprising:
   a source region, a drain region, and a channel formation region formed between said source region and said drain region, the respective regions being in contact with an insulating surface;
   a gate insulating film comprising at least a single layer on said channel formation region; and
   a gate electrode to be in contact with said gate insulating film;
   wherein said gate insulating film includes a layer of a silicon nitride oxide film containing boron.

8. A semiconductor device according to claim 7, wherein a composition ratio of boron in said silicon nitride oxide film is 0.1 to 50 atoms %.

9. A semiconductor device according to claim 7, wherein a composition ratio of oxygen in said silicon nitride oxide film is 1 to 30 atoms %.

10. A semiconductor device according to claim 7, wherein said semiconductor device is incorporated into a device selected from the group consisting of an electro-optical device and an electronic equipment.

11. A semiconductor device according to claim 10, wherein said electro-optical device is one selected from the group consisting of a liquid crystal display device, an EL display device, and EC display device, and an image sensor.

12. A semiconductor device according to claim 10, wherein said electronic equipment is one selected from the group consisting of a video camera, a digital camera, a projector, a goggle display, a car navigation system, a personal computer, and a portable information terminal.

13. A semiconductor device comprising:

an insulating film formed on an insulating surface; and a semiconductor component formed on said insulating film, said semiconductor component comprising as a source region, a drain region, and a channel formation region formed between the source region and the drain region, the respective regions being in contact with said insulating;

wherein said insulating film is a silicon nitride oxide film containing boron.

14. A semiconductor device according to claim 13, wherein a composition ratio of boron in said silicon nitride oxide film is 0.1 to 50 atoms %.

15. A semiconductor device according to claim 13, wherein a composition ratio of oxygen in said silicon nitride oxide film is 1 to 30 atoms %.

16. A semiconductor device according to claim 13, wherein said semiconductor device is incorporated into a device selected from the group consisting of an electro-optical device and an electronic equipment.

17. A semiconductor device according to claim 16, wherein said electro-optical device is one selected from the group consisting of a liquid crystal display device, an EL display device, an EC display device, and an image sensor.

18. A semiconductor device according to claim 16, wherein said electronic equipment is one selected from the group consisting of a video camera, a digital camera, a projector, a goggle display, a car navigation system, a personal computer, and a portable information terminal.

19. A semiconductor device comprising:

a semiconductor component formed on an insulating surface, said semiconductor component comprising a source region, a drain region, and a channel formation region; and an insulating film for protecting said semiconductor component, said insulation film being in contact with the source region, the drain region, and the channel formation region;

wherein said insulating film is a silicon nitride oxide film containing boron.

20. A semiconductor device according to claim 19, wherein a composition ratio of boron in said silicon nitride oxide film is 0.1 to 50 atoms %.

21. A semiconductor device according to claim 19, wherein a composition ratio of oxygen in said silicon nitride oxide film is 1 to 30 atoms %.

22. A semiconductor device according to claim 19, wherein said semiconductor device is incorporated into a device selected from the group consisting of an electro-optical device and an electronic equipment.

23. A semiconductor device according to claim 22, wherein said electro-optical device is one selected from the group consisting of a liquid crystal display device, an EL display device, an EC display device, and an image sensor.

24. A semiconductor device according to claim 22, wherein said electronic equipment is one selected from the group consisting of a video camera, a digital camera, a projector, a goggle display, a car navigation system, a personal computer, and a portable information terminal.

25. A semiconductor device according to claim 1, wherein an internal stress of said silicon nitride oxide film is a range of $-5\times10^{10}$ dyn/cm$^2$ to $5\times10^{10}$ dyn/cm$^2$.

26. A semiconductor device according to claim 7, wherein an internal stress of said silicon nitride oxide film is a range of $-5\times10^{10}$ dyn/cm$^2$ to $5\times10^{10}$ dyn/cm$^2$.

27. A semiconductor device according to claim 13, wherein an internal stress of said silicon nitride oxide film is a range of $-5\times10^{10}$ dyn/cm$^2$ to $5\times10^{10}$ dyn/cm$^2$.

28. A semiconductor device according to claim 19, wherein an internal stress of said silicon nitride oxide film is a range of $-5\times10^{10}$ dyn/cm$^2$ to $5\times10^{10}$ dyn/cm$^2$.

* * * * *